(12) United States Patent
Jovanovic

(10) Patent No.: US 10,860,749 B2
(45) Date of Patent: *Dec. 8, 2020

(54) METHOD FOR INTERACTIVE CATALOG FOR 3D OBJECTS WITHIN THE 2D ENVIRONMENT

(71) Applicant: Atheer, Inc., Mountain View, CA (US)

(72) Inventor: Milos Jovanovic, Portland, OR (US)

(73) Assignee: Atheer, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/944,614

(22) Filed: Apr. 3, 2018

(65) Prior Publication Data

US 2018/0225392 A1    Aug. 9, 2018

Related U.S. Application Data

(63) Continuation of application No. 14/710,569, filed on May 12, 2015, now Pat. No. 10,002,208.

(Continued)

(51) Int. Cl.
*G06T 15/20* (2011.01)
*G06F 30/00* (2020.01)
*G06F 30/13* (2020.01)
*G06F 3/0481* (2013.01)
*G06F 3/0484* (2013.01)
(Continued)

(52) U.S. Cl.
CPC ............ *G06F 30/00* (2020.01); *G06F 3/0486* (2013.01); *G06F 3/0488* (2013.01); *G06F 3/04815* (2013.01); *G06F 3/04845* (2013.01); *G06F 30/13* (2020.01); *G06T 13/205* (2013.01); *G06T 15/10* (2013.01); *G06T 15/20* (2013.01); *G06T 19/006* (2013.01); *G06T 19/20* (2013.01); *G06F 2203/04802* (2013.01); *G06T 2215/12* (2013.01); *G06T 2215/16* (2013.01); *G06T 2219/004* (2013.01); *G06T 2219/008* (2013.01); *G06T 2219/012* (2013.01); *G06T 2219/2004* (2013.01); *G06T 2219/2008* (2013.01); *G06T 2219/2012* (2013.01); *G06T 2219/2016* (2013.01); *G06T 2219/2024* (2013.01)

(58) Field of Classification Search
USPC ........................................................ 345/427
See application file for complete search history.

(56) References Cited

U.S. PATENT DOCUMENTS 6,771,276 B1    8/2004  Highsmith et al.
6,809,745 B1   10/2004  O'Donnell et al.
(Continued)

OTHER PUBLICATIONS

Horry, Y. et al., "Tour Into the Picture: Using a Spidery Mesh Interface to Make Animation from a Single Image," Proceedings of the 24th Annual Conference on Computer Graphics and Interactive Techniques (SIGGRAPH '97), Aug. 3, 1997, Los Angeles, California, 9 pages.

*Primary Examiner* — Charles Tseng
(74) *Attorney, Agent, or Firm* — Miller IP Law, LLC

(57) ABSTRACT

Example systems and methods for virtual visualization of a three-dimensional (3D) model of an object in a two-dimensional (2D) environment. The method may include providing an interactive catalog associated with the 3D model of the object while positioning the 3D model of the object onto the 2D environment. In one aspect, the method may include price and product detail information associated with the 3D model of the object.

20 Claims, 13 Drawing Sheets

Related U.S. Application Data

(60) Provisional application No. 61/992,759, filed on May 13, 2014, provisional application No. 61/992,629, filed on May 13, 2014, provisional application No. 61/992,719, filed on May 13, 2014, provisional application No. 61/992,774, filed on May 13, 2014, provisional application No. 61/992,746, filed on May 13, 2014, provisional application No. 61/992,665, filed on May 13, 2014.

(51) Int. Cl.
*G06F 3/0486* (2013.01)
*G06F 3/0488* (2013.01)
*G06T 13/20* (2011.01)
*G06T 15/10* (2011.01)
*G06T 19/00* (2011.01)
*G06T 19/20* (2011.01)

(56) References Cited

U.S. PATENT DOCUMENTS

| | | | |
|---|---|---|---|
| 6,891,533 B1 | 5/2005 | Alcorn et al. | |
| 7,062,722 B1 | 6/2006 | Carlin et al. | |
| 7,277,572 B2 | 10/2007 | MacInnes et al. | |
| 7,425,958 B2 | 9/2008 | Berger et al. | |
| 7,523,411 B2 | 4/2009 | Carlin | |
| 8,099,237 B2 | 1/2012 | Mays et al. | |
| 8,878,846 B1 * | 11/2014 | Francis, Jr. | G06T 19/006 345/420 |
| 9,129,433 B1 | 9/2015 | Korobkin | |
| 9,330,503 B2 | 5/2016 | Mital et al. | |
| 9,514,753 B2 | 12/2016 | Sharifi et al. | |
| 9,911,228 B2 * | 3/2018 | Pershing | G06T 17/20 |
| 2004/0105573 A1 | 6/2004 | Neumann et al. | |
| 2005/0002662 A1 | 1/2005 | Arpa et al. | |
| 2007/0098290 A1 | 5/2007 | Wells | |
| 2007/0124215 A1 | 5/2007 | Simmons, Jr. | |
| 2008/0071559 A1 * | 3/2008 | Arrasvuori | G06Q 30/06 705/26.1 |
| 2008/0222503 A1 | 9/2008 | Sandige et al. | |
| 2009/0113349 A1 | 4/2009 | Zohar et al. | |
| 2009/0125801 A1 | 5/2009 | Algreatly | |
| 2010/0001992 A1 | 1/2010 | Schultz et al. | |
| 2010/0030578 A1 | 2/2010 | Siddique et al. | |
| 2010/0194863 A1 | 8/2010 | Lopes et al. | |
| 2010/0208033 A1 | 8/2010 | Edge et al. | |
| 2010/0208057 A1 | 8/2010 | Meier et al. | |
| 2010/0289817 A1 | 11/2010 | Meier et al. | |
| 2011/0188760 A1 | 8/2011 | Wright et al. | |
| 2012/0030089 A1 | 2/2012 | Ram et al. | |
| 2012/0070101 A1 | 2/2012 | Kogan et al. | |
| 2012/0105581 A1 | 5/2012 | Berestov et al. | |
| 2012/0169847 A1 | 7/2012 | Lee et al. | |
| 2012/0183204 A1 | 7/2012 | Aarts et al. | |
| 2012/0218423 A1 * | 8/2012 | Smith | G06Q 30/02 348/207.1 |
| 2013/0002649 A1 | 1/2013 | Wu et al. | |
| 2013/0073388 A1 | 3/2013 | Heath | |
| 2013/0141530 A1 * | 6/2013 | Zavesky | H04N 21/21805 348/43 |
| 2013/0187905 A1 | 7/2013 | Vaddadi et al. | |
| 2013/0222385 A1 * | 8/2013 | Dorsey | G06T 11/20 345/427 |
| 2014/0104315 A1 | 4/2014 | Kapler et al. | |
| 2014/0132633 A1 * | 5/2014 | Fekete | G06T 11/60 345/634 |
| 2014/0178029 A1 * | 6/2014 | Raheman | H04N 5/772 386/224 |
| 2017/0011558 A1 * | 1/2017 | Meier | G06T 15/20 |

* cited by examiner

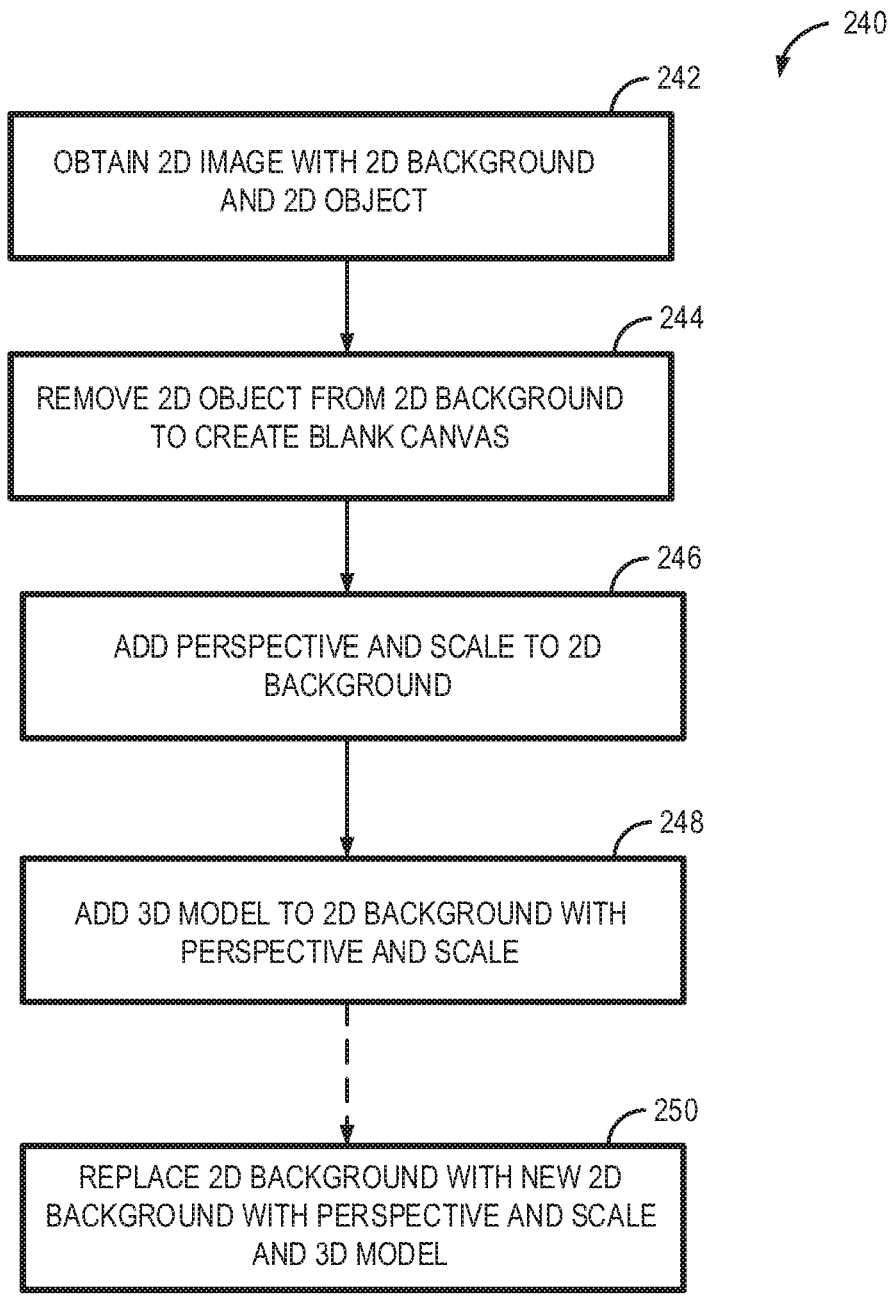

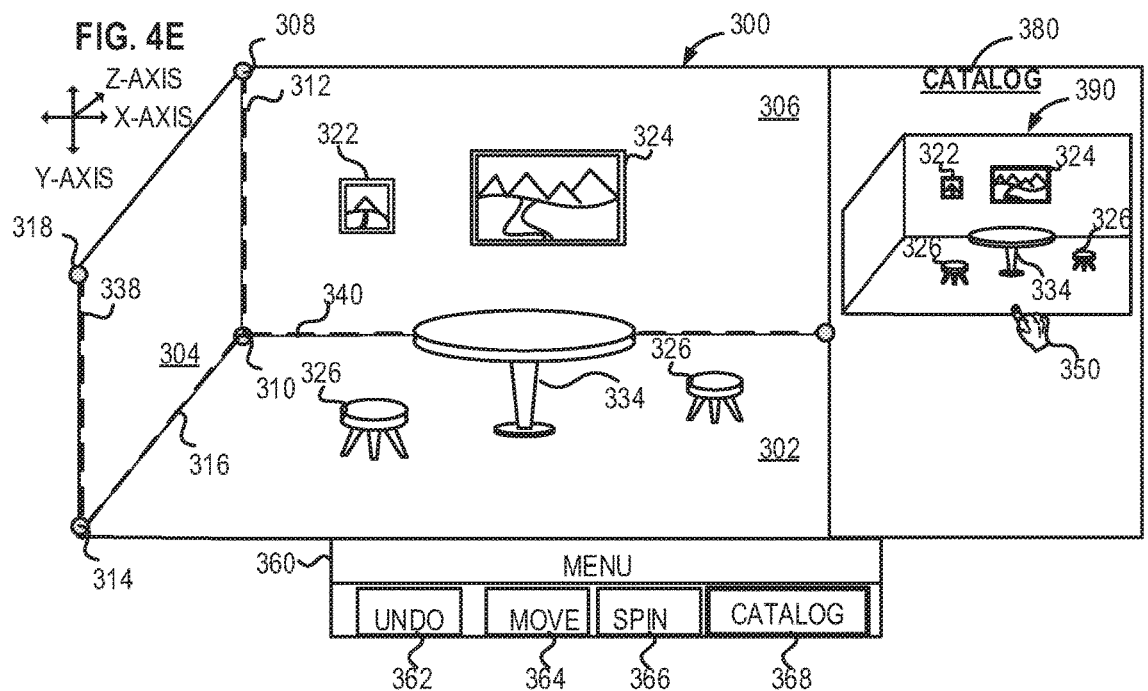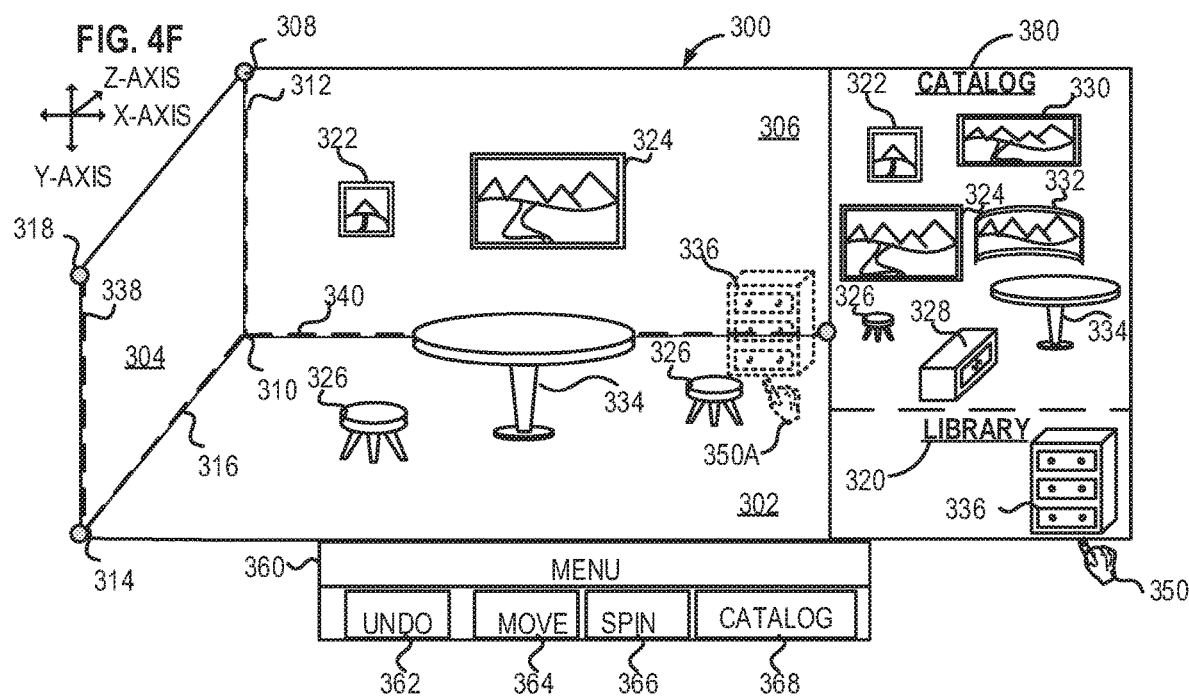

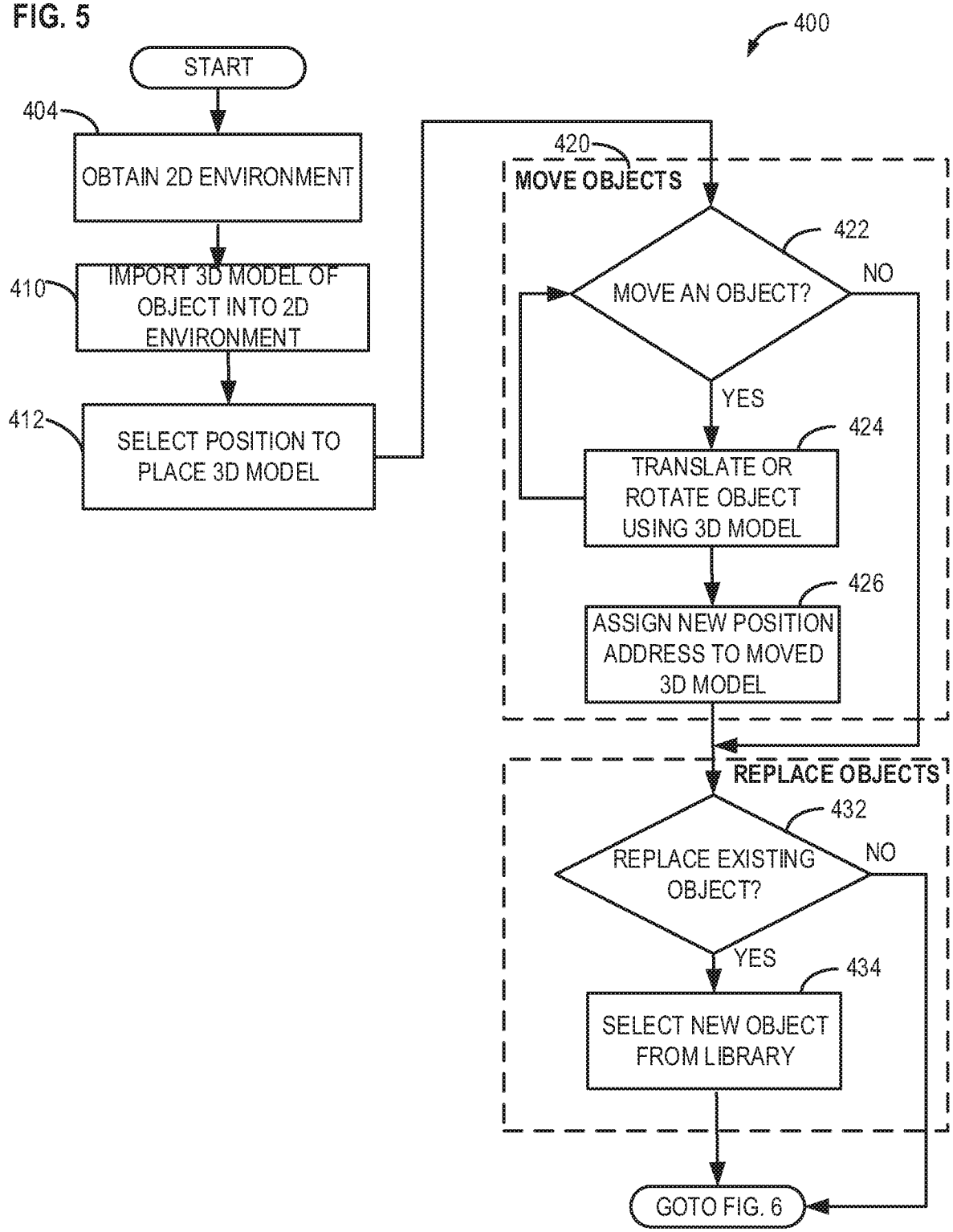

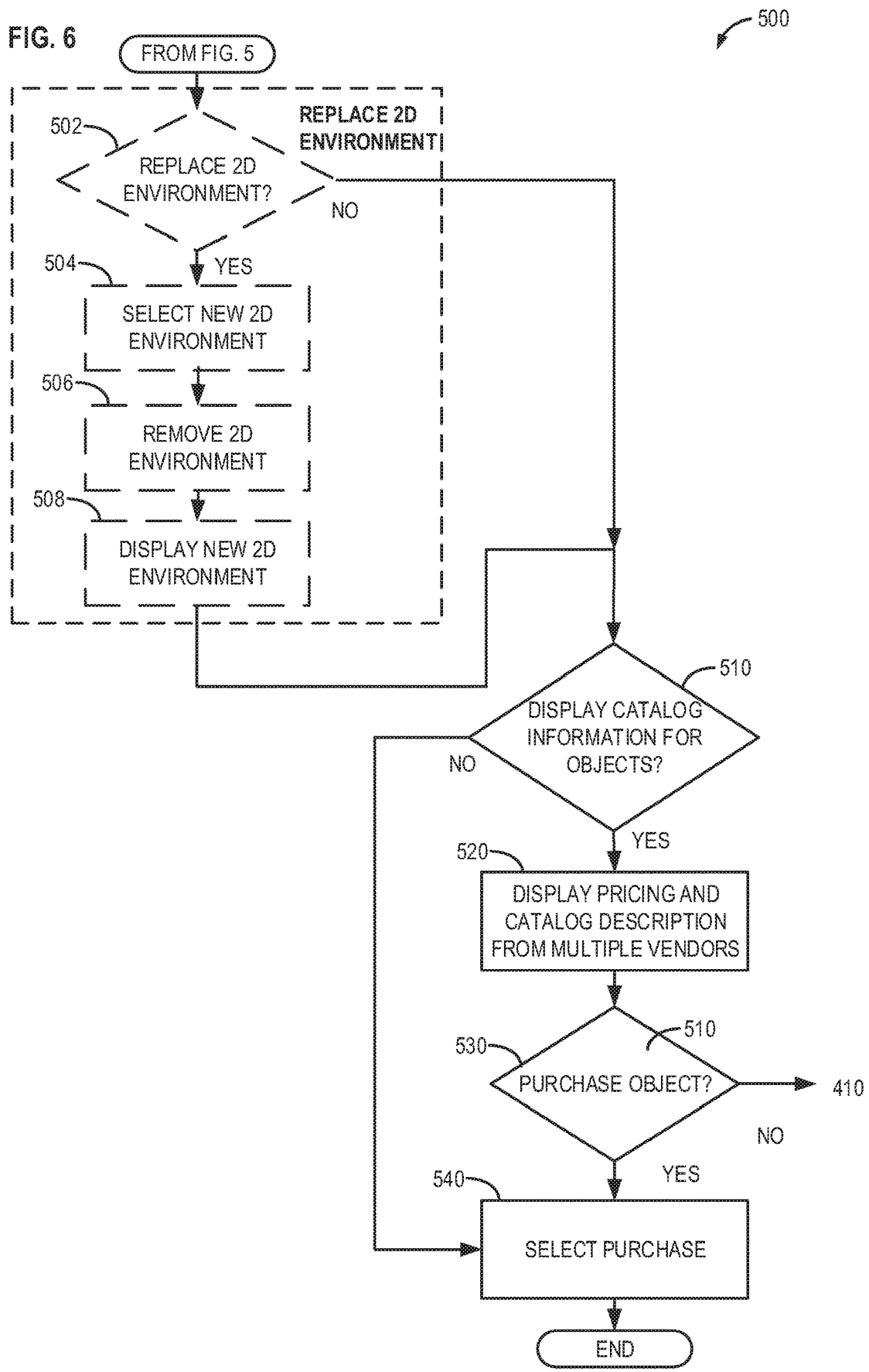

METHOD FOR INTERACTIVE CATALOG FOR 3D OBJECTS WITHIN THE 2D ENVIRONMENT

CROSS REFERENCE TO RELATED APPLICATIONS

The present application is a continuation of U.S. patent application Ser. No. 14/710,569 entitled "METHOD FOR INTERACTIVE CATALOG FOR 3D OBJECTS WITHIN THE 2D ENVIRONMENT" filed on May 12, 2015. U.S. patent application Ser. No. 14/710,569 claims priority to U.S. Provisional Patent Application No. 61/992,759 entitled "METHOD FOR FORMING WALLS TO ALIGN 3D OBJECTS IN 2D ENVIRONMENT", filed on May 13, 2014. U.S. patent application Ser. No. 14/710,569 also claims priority to U.S. Provisional Patent Application No. 61/992,629 entitled "METHOD FOR PROVIDING SCALE TO ALIGN 3D OBJECTS IN 2D ENVIRONMENT", filed on May 13, 2014. U.S. patent application Ser. No. 14/710,569 claims further priority to U.S. Provisional Patent Application No. 61/992,719 entitled "METHOD FOR PROVIDING A PROJECTION TO ALIGN 3D OBJECTS IN 2D ENVIRONMENT", filed May 13, 2014. U.S. patent application Ser. No. 14/710,569 claims further priority to U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014. U.S. patent application Ser. No. 14/710,569 claims further priority to U.S. Provisional Patent Application No. 61/992,746 entitled "METHOD FOR REPLACING 3D OBJECTS IN 2D ENVIRONMENT", filed May 13, 2014. U.S. patent application Ser. No. 14/710,569 claims further priority to U.S. Provisional Patent Application No. 61/992,665 entitled "METHOD FOR INTERACTIVE CATALOG FOR 3D OBJECTS WITHIN THE 2D ENVIRONMENT", filed May 13, 2014. The entire contents of the above-listed applications are hereby incorporated by reference for all purposes.

BACKGROUND AND SUMMARY

Interior design may involve developing and evaluating a design for a room or environment. For example, a user may wish to know the price of various objects, including furniture, lighting fixtures, and wall hangings, which the user decides to place within a two-dimensional (2D) environment, such as a living room. Conventional interior design tools may enable the user to position a three-dimensional (3D) model of an object by selecting the object, and "dragging and dropping" the object to a location in the 2D environment using a mouse, keyboard or other input device.

The inventors herein have recognized various issues with the above methods. Namely, although objects may be positioned independently within the 2D environment, it may be difficult to obtain the price and product information of the 3D objects. Additionally, the user may prefer to know manufacturer and retailer for the 3D object.

One approach that at least partially addresses the above issues may include a method for presenting the user with an interactive catalog, where the user interactive catalog may include information regarding product pricing, product dimension details, retailer, and manufacturer information. The user may be able to browse the content associated with the 3D object.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE FIGURES

FIG. 2 is a schematic flow chart for creation of an interactive catalog and a 3D model of objects in a 2D environment.

FIGS. 4A, 4B, 4C, 4D, 4E, 4F, 4G, and 4H are example representations of a 2D environment.

FIG. 5 is an example flowchart for a method of placing 3D objects in the 2D environment with interactive catalog options.

FIG. 6 is a continuation of the example flowchart for a method of placing 3D objects in the 2D environment with interactive catalog options.

DETAILED DESCRIPTION

Figure 1A:
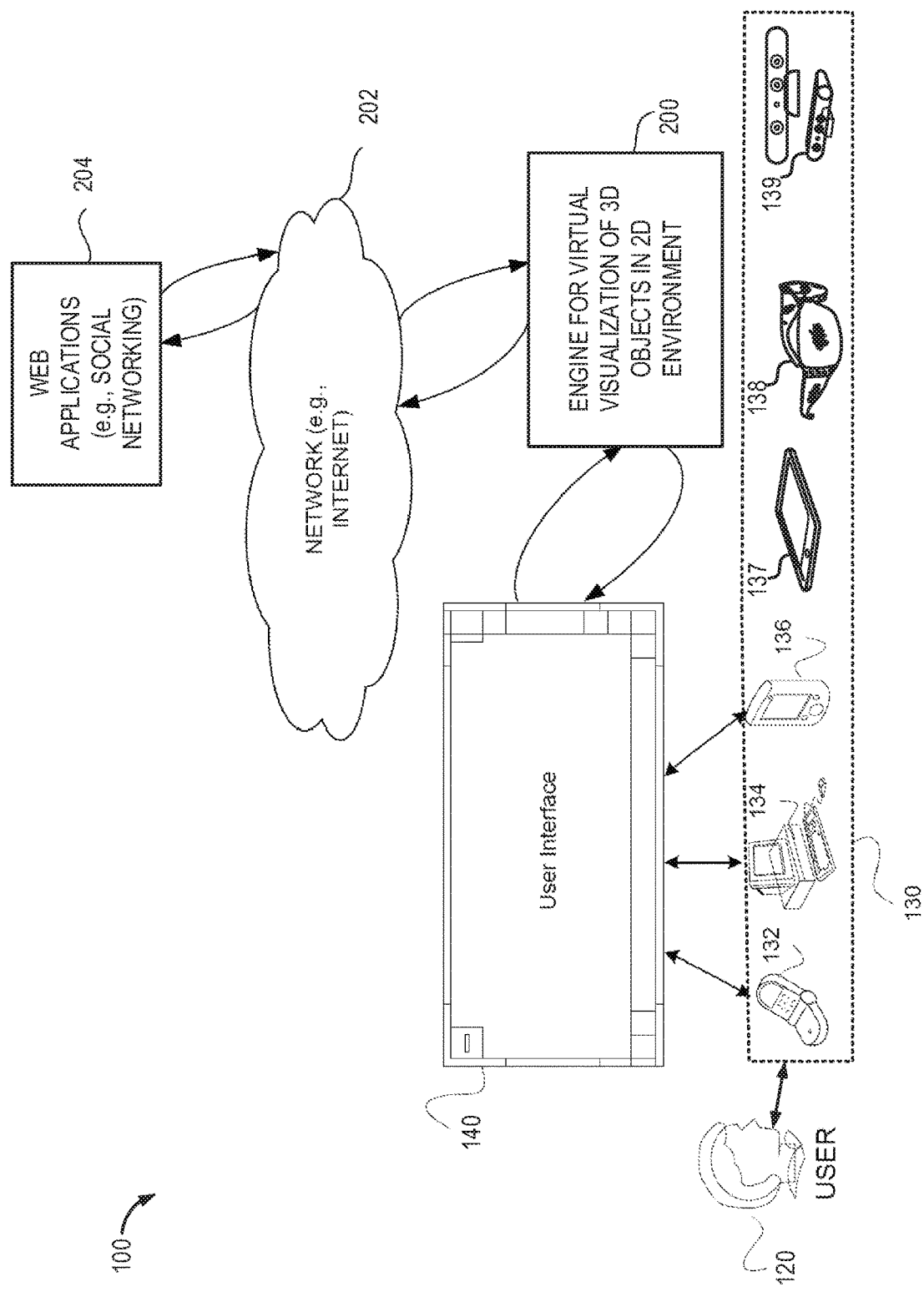
FIG. 1A is a block diagram illustrating the overall system for visualization of 3D models of objects in a 2D environment, in accordance with various embodiments.

The present description relates to visualization and adding of 3D models of objects to a 2D environment, wherein the 2D environment is a real environment represented by a photo or video. A user may import photographic images, digital images, video images, and other graphical representations of the 2D environment. Further, the 2D environment may include existing graphical materials or graphical materials captured as a still image or a live feed image. The 2D environment may serve as the background environment for adding a 3D model of an object.

The 3D object is associated with object information data which includes a defined set of parameters relevant to the 3D object. The parameters may include attributes, instructions, and other such scripts associated and essential for graphical use of the 3D object. Characteristics of the 3D object, interaction between object entities may be analyzed with such associated data. The object information data associated with the 3D object may include geometric attributes, depth value, color value, and such other properties. For example, geometric attributes of the 3D object, such as a chair, may include height and width information. If a user decides to place the chair near a table, already present in the 2D environment, the height and width information for the chair may help the user in precise aligning.

The object information data may also include metadata encoding one or more of a set of parameters relevant to the 3D object, manufacturer's guidelines, regulations and guidelines governing the 3D object, safety guidelines for the 3D object, and any other relevant information specific to the 3D object.

The object information data may include metadata defining the behavior of the 3D object within the 2D environment. For example, a 3D object may include metadata defining an object as one of a wall object, ceiling object, floor object, or combination thereof. The metadata may further define the placement and movement of the object within the environment.

The object information data may also include metadata encoding an information tag. The information tag may include a description of the 3D object including dimensions, materials, cost, manufacturer, and other information specific to the 3D object discussed below.

The object information data may also include metadata encoding graphical data, spatial data, and other rendering data for superimposing the 3D object within the 2D environment. Graphical, spatial, and rendering data may be processed by a computing device to generate and display the 3D object to the user.

The parameters may include attributes, instructions, behavior characteristics, visualizations to be displayed by the 3D object, and other such scripts associated and essential for graphical use of the 3D object. For example, the parameters may include, but are not limited to, the physical dimensions of the 3D object, mounting requirements for the 3D object, metadata identifying the 3D object as a floor object, wall object, ceiling object, or combination thereof, power requirements, length of a power cord, and any other relevant information describing the 3D object.

Additionally, the object information data may include additional parameters such as manufacturer's guidelines and/or safety guidelines for safe and proper installation and operation of the 3D object. For example, the object information data may include metadata encoding a minimum clearance or spatial requirement surrounding the 3D object. The minimum clearance/spatial requirement may be required for adequate ventilation of the 3D object, prevention of fire hazards, noise control, clearance of moving parts of the 3D object, or to satisfy any other personal safety, medical safety, or industrial safety standard. As an example, a display may require 6 inches clear from the cooling fan gratings to allow for proper airflow to cool the electric internals within the display. As another example, in a medical application, a magnetic resonance imager may generate an electro-magnetic field in an area surrounding the magnetic resonance imager that may interfere with other electrically powered or magnetically sensitive medical equipment, personal medical equipment such as a pacemaker, and any magnetic material that may be drawn to the magnetic resonance imager by magnetic attraction. In an industrial application, some industrial equipment have moving or rotating parts that may extend past the main body of the piece of industrial equipment. Therefore, to allow for proper operation of the industrial equipment, other equipment or objects may be located outside a minimum clearance or spatial requirement surrounding the piece of industrial equipment.

In another example, in a restaurant environment, the tables, chairs, and other objects within the restaurant space may be required to be arranged such that a minimum clearance surrounding each object is maintained and that pathways for traversal are maintained clear and of sufficient dimensions to meet federal and local accommodation codes. Therefore, each chair and each table may include a minimum clearance or spatial requirement surrounding the table or chair to meet the governing guidelines.

In another example, in a retail environment, retail display fixtures may be arranged within the retail space such that a minimum clearance surrounding each fixture may be maintained to allow shoppers to easily move within the retail space and to meet federal and local accommodation codes. In addition to satisfaction of the governing access codes, the 3D models of the display fixtures and accompanying merchandise may be arranged within the 2D image of the retail space allowing retail planners to efficiently design retail merchandising plans, design retail exhibit plans, and then electronically distribute the design plans to the stores. Further, the retail merchandising teams at the stores may propose amendments to the design plans that are specific to the available retail space within the store accounting for differences due to the specific architectural design of the store space. These amendments may then be reviewed and approved by the retail planners, thereby providing an advantage of an efficient and electronic means of distributing, amending, and approving retail merchandising plans.

The object information data may be provided by multiple sources, including but not limited to, one or more of the manufacturer of the 3D object, government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means. It will be appreciated that the listed sources of object information data are not intended to be limiting.

In some embodiments, the object information data may include one or more spatial requirements. The spatial requirements may exceed the geometric dimensions of the 3D object and govern interactions between the 3D object and other object entities. The spatial requirements of a 3D object may be specific to the object based upon one or more of a manufacturer's recommendation, imported from a remote database, government regulation, configured by the user, or any other suitable source.

In some embodiments, the two-dimensional environment may also include environmental information data. The environmental information data may include metadata which may encode one or more of a set of properties relevant to the 2D environment, regulations and guidelines governing the 2D environment such as governing access regulations, industrial safety standards, and governing fire codes, safety guidelines for the 2D environment, and any other relevant information specific to the 2D environment. The properties encoded by environmental information data may include one or more of the dimensions of the 2D environment, characteristics of the 2D environment governing the behavior and movement of 3D objects within the 2D environment, locations of power supplies and the voltage and frequency supplied, construction information such as location of load bearing members, allowable load information, construction materials, available ventilation, acoustic information, fixed lighting sources, and any other information relevant to the two-dimensional environment.

The environmental information data may be provided by multiple sources such as one or more of government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means.

In these embodiments properties of the 2D environment may be retrieved from the environmental information data and analyzed to determine interaction with 3D objects within the 2D environment. As a non-limiting example, one or more threshold barriers between two planes of the 2D environment may be adjusted to satisfy one or more conditions encoded in the metadata of both the environmental information data and the object information data.

In some embodiments, the physical properties of the 3D object, interaction between object entities, and interactions between object entities and the 2D environment may be analyzed with such associated data.

As the data associated with the 3D object is transferred to the 2D environment, the 3D object may be visualized in the 2D environment with respect to scale and perspective of the 2D environment. The 2D environment including the 3D object may be referred to as a modeled 2D environment. Within the 2D environment, the user may move the 3D object in a vertical direction, horizontal direction, or in a rotational manner. For example, if the 3D object is a wall painting, the user may move the wall painting in a vertical or horizontal manner on a wall plane of the 2D environment; whereas, if the 3D object is a chair on a ground plane of the 2D environment, the user may move the chair in a horizontal or rotational manner.

Within the 2D environment, the user may also generate a projection of the 3D object on a surface in the 2D environment, where the surface may be a horizontal plane, a vertical plane, an inclined plane, a curved surface or another such plane. The projection thus formed may be used as a guide to move, adjust, and align the 3D object in the 2D environment in accordance to the user's preference, relative to other objects in the 2D environment. Further, the user may insert an additional 3D object onto the 2D environment. The projection from the previously added 3D object may be used as a guide by the user to align and adjust the additionally added 3D object. In some embodiments, the projection may be vertically displaced from the object but not horizontally displaced.

The user may save the resulting image to a personal computer (PC) or network database for future use or reference, or post the resulting image on a social network, and perform other operations on the image. Further, the user may have some previously saved images which the user may use to compare with the newly obtained images in order to select preferable combinations of a 3D object in a 2D background. The user may use his preferences before purchasing one or more 3D objects for the 2D environment.

Additionally, the user may be connected to various social networking services and/or microblogs, such as Facebook™, Twitter™, and other such networking services. Connection to social networking services and/or microblogs may allow user to interact with his contacts to share and obtain opinion and feedback on image obtained after placing 3D objects in 2D environment. Further, the user may also request help from designing services to arrange 3D objects within a given 2D environment.

Visualization and addition of 3D objects to any 2D environment provides ample opportunities in various spheres of human life. Spatial representation of 3D objects may help in comprehending and learning, designing and drafting, efficient space management, and accelerated decision making and planning. The ability to represent virtual 3D objects in a real environment can provide further applications, such as selecting furniture for a house, designing kitchen cabinets, selecting display and presentation equipment for conference rooms, presentation layouts for tradeshow booths, industrial planning and industrial equipment placement, medical equipment placement, and other space and design applications.

Figure 1B:
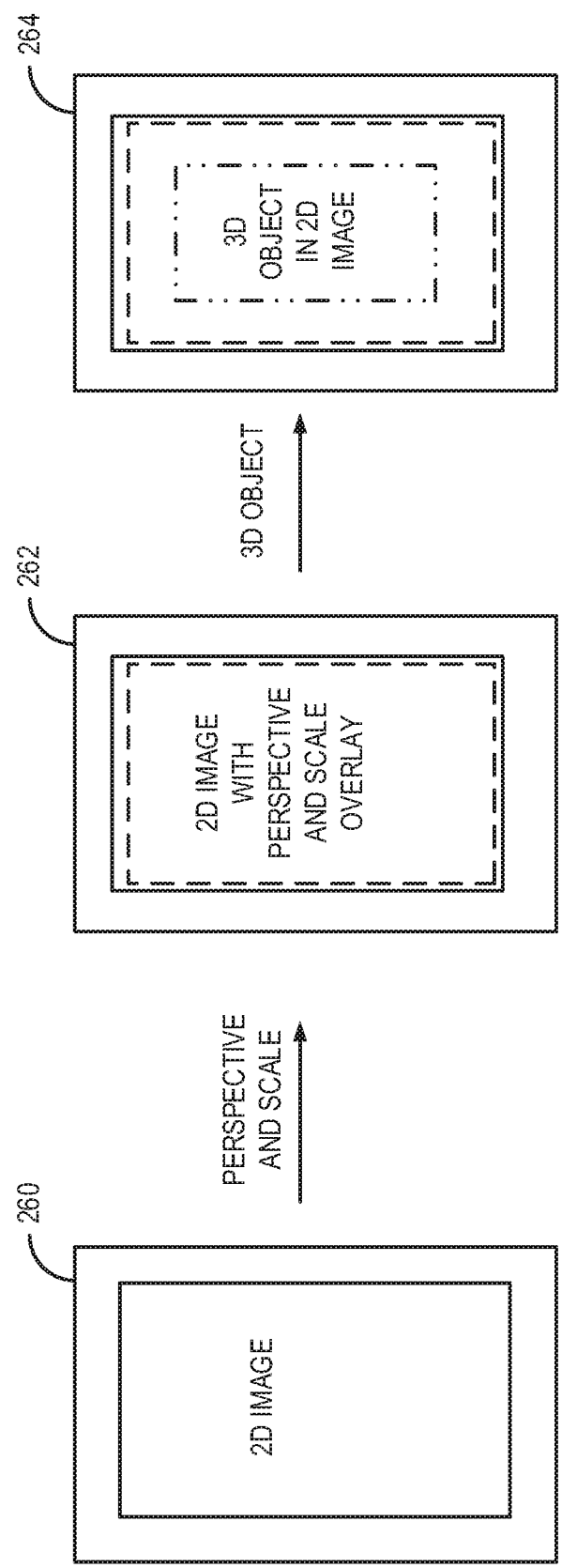
FIG. 1B is a schematic illustration of a system for visualization of 3D model of objects in a 2D environment.
Figure 3:
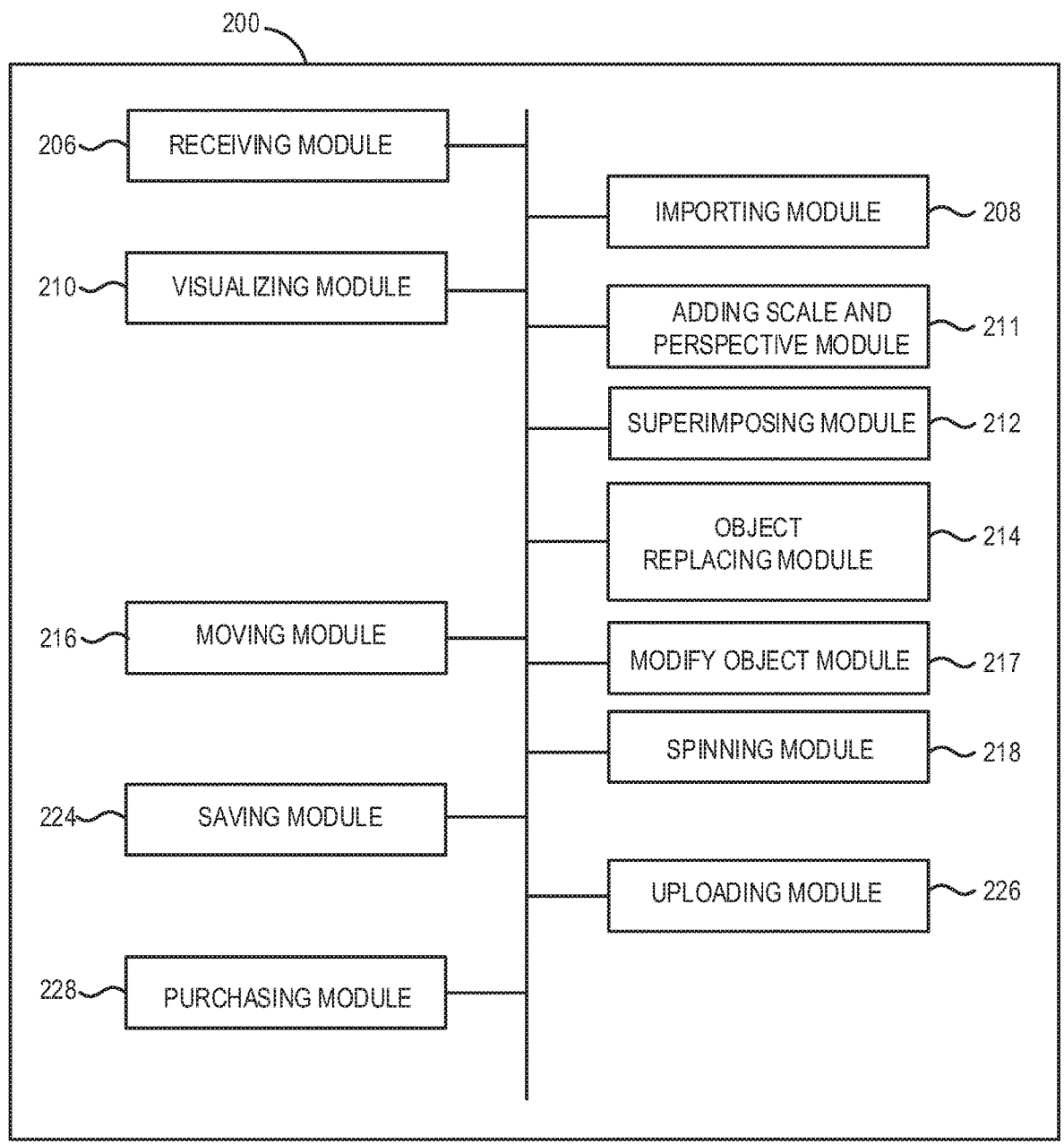
FIG. 3 is a block diagram showing various modules of an engine for visualization of 3D models of objects in a 2D environment, in accordance with various embodiments.
Figure 7A:
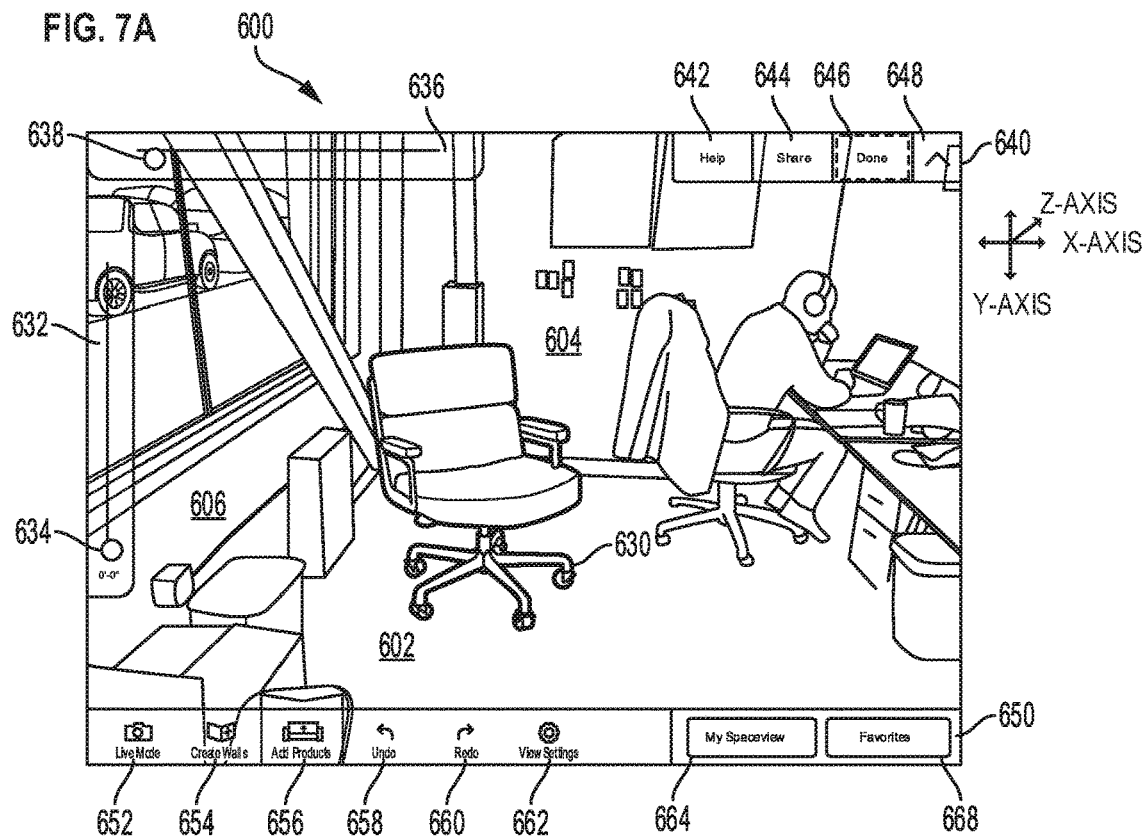
FIGS. 7A, 7B, 7C and 7D are example representations of an example 2D environment.
Figure 7B:
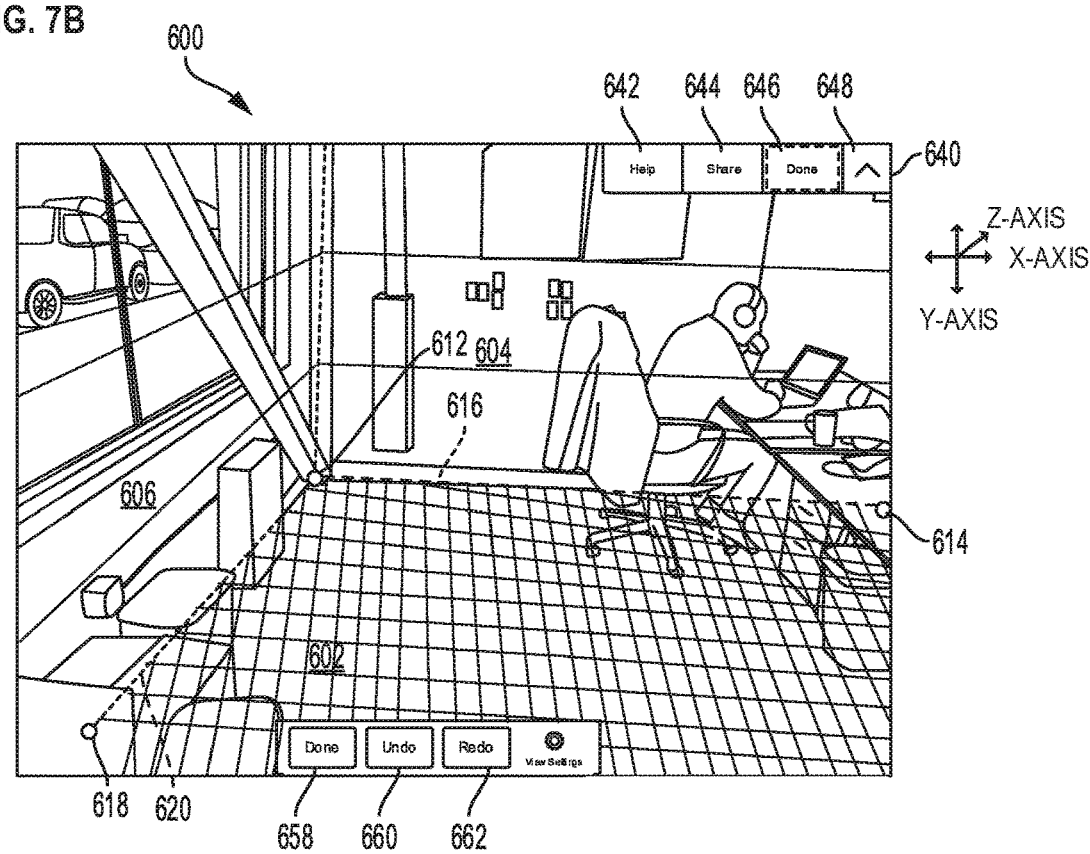
Figure 7C:
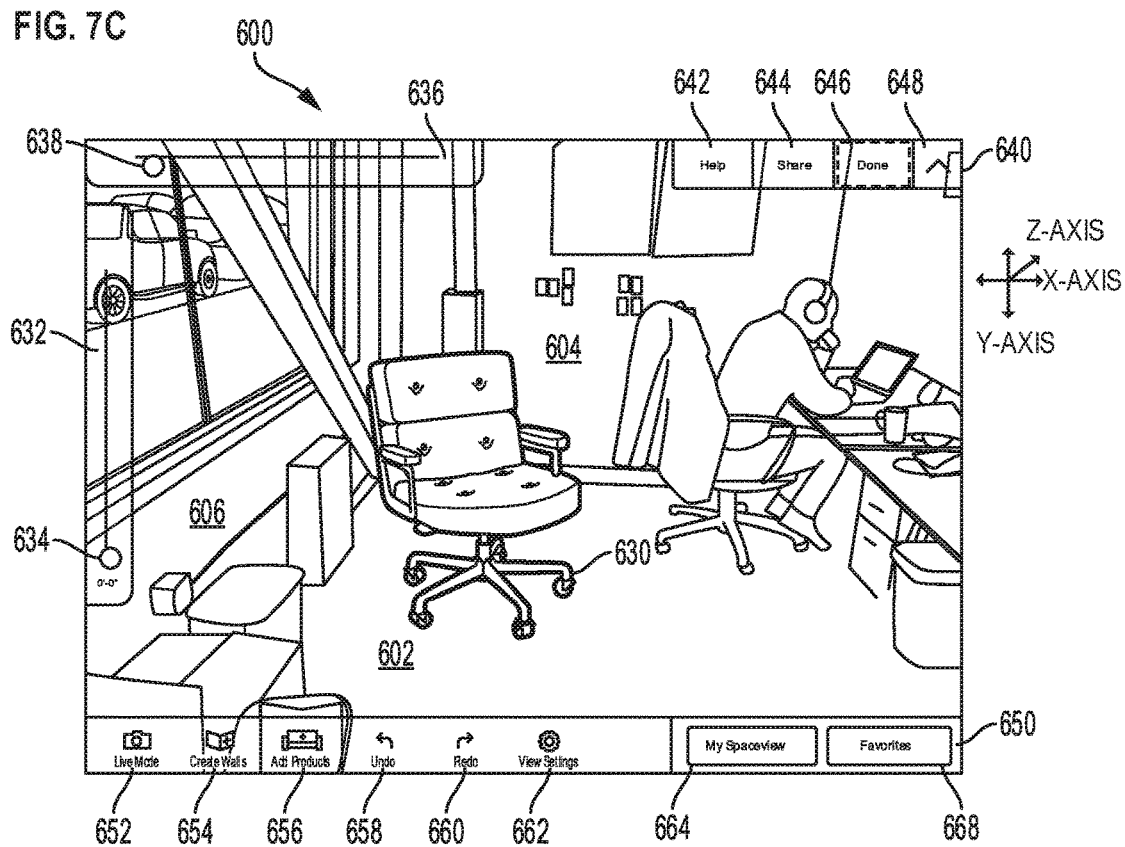
Figure 7D:
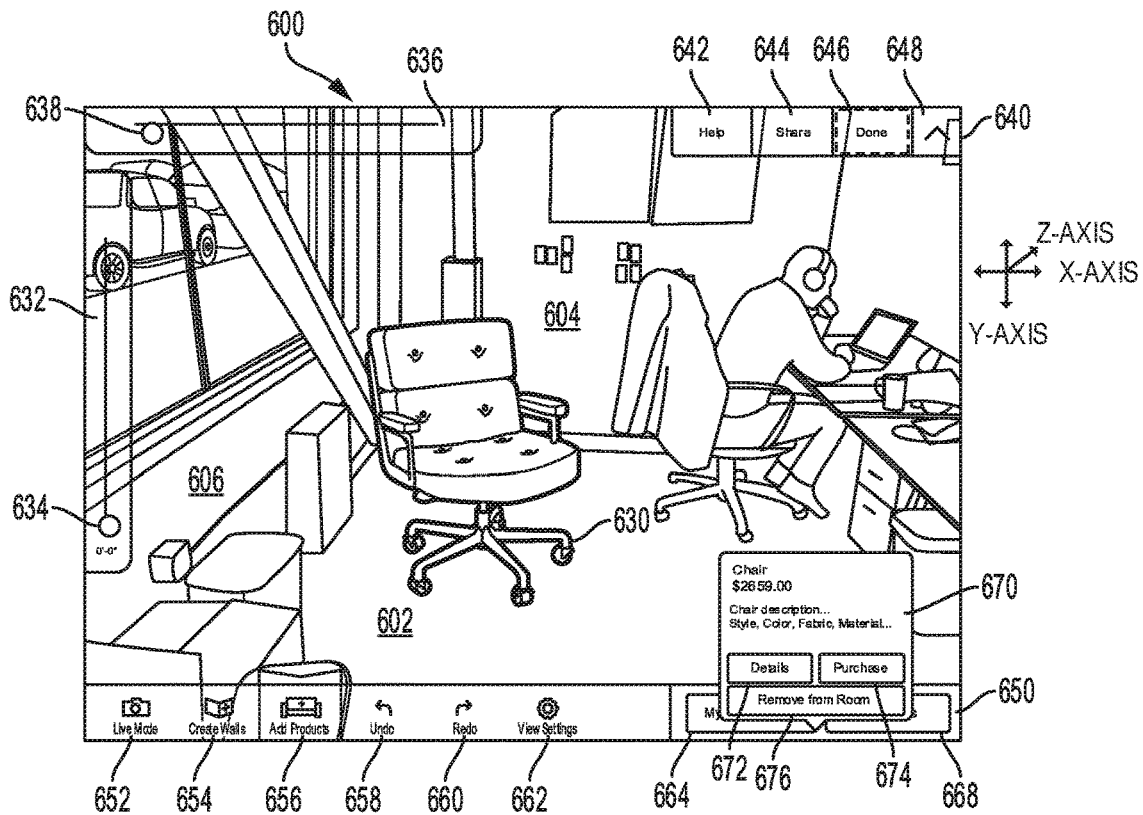
Figure 8:
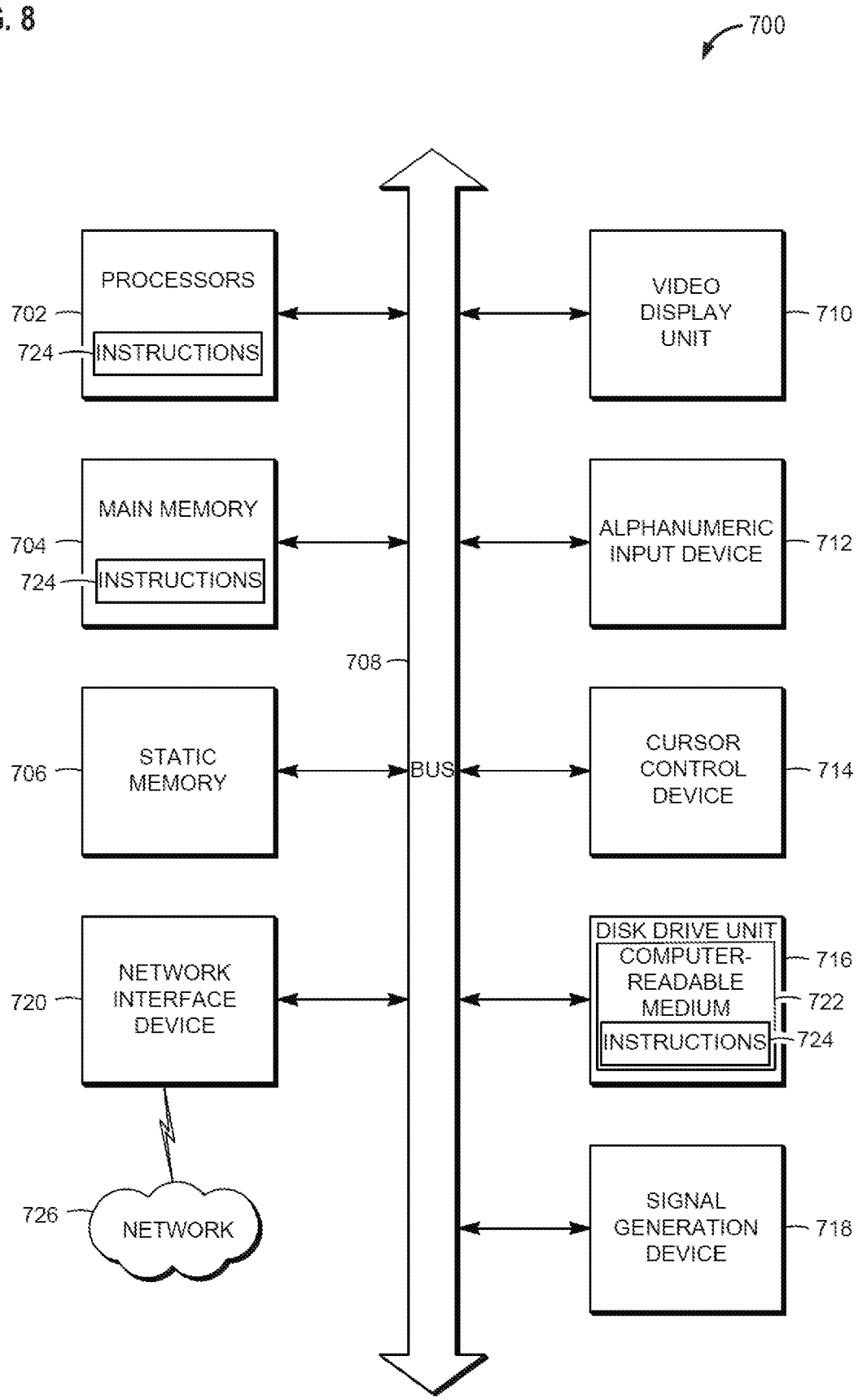
FIG. 8 illustrates an example of a computer network system, in which various embodiments may be implemented.

FIG. 1A is a block diagram illustrating the overall system for visualization of 3D models of objects in a 2D environment, in accordance with various embodiments of the present application. FIG. 1B is a schematic illustration of a system for visualization of 3D model of objects in a 2D environment. FIG. 2 is a schematic flow chart for creation of an interactive catalog and a 3D model of objects in a 2D environment. FIG. 3 is a block diagram showing various modules of an engine for visualization of 3D models of objects in the 2D environment. FIGS. 4A, 4B, 4C, 4D, 4E, and 4F are representative examples of moving a 3D object and projecting a projection of the 3D object in the modeled 2D environment including an interactive catalog. FIGS. 5 and 6 are an example flowchart for a method of placing the 3D object in the modeled 2D environment. FIGS. 7A and 7B are example representations of an example 2D environment with displayed 3D objects. FIGS. 7C and 7D are example representations of the 2D environment illustrated in FIGS. 7A and 5B, displaying different 3D objects. FIG. 8 illustrates an example of a computer network system, in which various embodiments may be implemented.

FIG. 1A illustrates a block diagram of an overall system 100 for visualization of 3D objects in a 2D environment, in accordance with various embodiments of the present disclosure. Overall system 100 may include a user 120, user devices 130, a user interface 140, an engine 200 for virtual visualization of 3D models of objects in 2D environment, a network 202, and various web applications 204. The user devices 130 may include a mobile phone 132, a personal computer (PC) 134, a personal digital assistant (PDA) 136, a tablet PC 137, a wearable computer device 138 such as Google Glass™ and Recon Jet™, a 3D scanner 139 and the like. The user 120 via user devices 130 interacts with the user interface 140. The user may also directly interact with the user interface via touchscreen, keyboard, mouse key, touch pad and the like. The engine 200 for visualization of 3D objects in 2D environment may comprise of local device-based, network-based, or web-based service available on any of the user devices 130. The user may further interact with the web applications 204. The web applications may include social networking services.

The user 120 may interact with the user interface 140 via the user devices 130. The system for virtual visualization of 3D models of objects in 2D environment 300 may be implemented on a local device or via a network-based or web-based service accessible via user devices 130. The user 120 may periodically interact with the system for virtual visualization of 3D models of objects in 2D environment 300 via the user interface 140 displayed using one of the user devices 130. Additionally, the user 120 may periodically interact with the web application 204 such as a social networking service (including social networks, microblogs, web blogs, and other web resources) via the system for virtual visualization of 3D models of objects in 2D environment 300 and the network 110 to upload graphics obtained using the system for virtual visualization of 3D models of objects in 2D environment 300, communicate with members of the social networking service, or request help from design services, or purchase a 3D object through web applications 204.

The user devices 130, in some example embodiments, may include a Graphical User Interface (GUI) for displaying the user interface 140. In a typical GUI, instead of offering only text menus or requiring typed commands, the system 200 may present graphical icons, visual indicators, or graphical elements called widgets that may be utilized to allow the user 120 to interact with the user interface 140. The user devices 130 may be configured to utilize icons in conjunction with text, labels, or text navigation to fully represent the information and actions available to users.

The network 202 may include the Internet or any other network capable of communicating data between devices. Suitable networks may include or interface with one or more of, for instance, a local intranet, a Personal Area Network (PAN), a Local Area Network (LAN), a Wide Area Network (WAN), a Metropolitan Area Network (MAN), a virtual private network (VPN), a storage area network (SAN), an Advanced Intelligent Network (AIN) connection, a synchronous optical network (SONET) connection, Digital Subscriber Line (DSL) connection, an Ethernet connection, an Integrated Services Digital Network (ISDN) line, a cable modem, an Asynchronous Transfer Mode (ATM) connection, or an Fiber Distributed Data Interface (FDDI) or Copper Distributed Data Interface (CDDI) connection. Furthermore, communications may also include links to any of a variety of wireless networks, including Wireless Application Protocol (WAP), General Packet Radio Service (GPRS), Global System for Mobile Communication (GSM), Code Division Multiple Access (CDMA) or Time Division Multiple Access (TDMA), cellular phone networks, Global Positioning System (GPS), Cellular Digital Packet Data (CDPD), Research in Motion (RIM), limited duplex paging network, Bluetooth radio, or an IEEE 802.11-based radio frequency network. The network 202 may further include or interface with any one or more of an RS-232 serial connection, an IEEE-1394 (Firewire) connection, a Fiber Channel connection, an IrDA (infrared) port, a Small Computer Systems Interface (SCSI) connection, a Universal Serial Bus (USB) connection or other wired or wireless, digital or analog interface or connection, mesh. The network 202 may be a network of data processing nodes that are interconnected for the purpose of data communication.

FIG. 1B is a schematic illustration of a system for visualization of 3D models of objects in a 2D environment. Specifically, as shown and described in more detail herein, a 2D environment may be provided including a 2D image 260. The 2D image 260 may be a photograph, line drawing or video. For example, the 2D image 260 may be a picture of a room or part of a room. The 2D image 260 may be a personalized image captured by a user's hand-held device or other computing device. In other examples, the 2D image 260 may be saved or imported from a storage device on a remote server or other device.

Perspective and scale may be added to the 2D image 260. The perspective and scale may be saved as part of the image such that the 2D image is now a combined image 262 having both the 2D information and perspective and scale information associated with the 2D image.

In some examples and as described in more detail herein, walls may be selectively positioned within the image. Further, in some examples, a 3D object may then be positioned within the 2D image with perspective and scale overlay, combined image 262. The 3D object may be realistically positioned within the resulting image 264 based on the perspective and scale overlay information. Further, the 3D object may be positioned within resulting image 264 such that the 3D object may be perceived in three dimensions within the 2D environment.

A 3D object may then be positioned within the 2D image with perspective and scale overlay 262. The 3D object may be realistically positioned within the resulting image 264 based on the perspective and scale overlay information.

FIG. 2 provides a schematic flow chart of a method 240 for creation of an interactive catalog for use with insertion in a 2D environment. Aspects of the general steps will be disclosed in more detail in the additional figures and specification.

At 242, a 2D image with a 2D background and one or more 2D objects may be obtained. The 2D image may be a photograph of a room with furniture. At 244, in some example embodiments, one or more 2D objects may be removed from the 2D background to create a blank canvas. At 246, perspective and scale may be added to the 2D background. The empty room then provides a canvas for a user to select 3D objects from an interactive catalog. As such, as shown in FIG. 2, at 248 a 3D model of an object may be selected for display in the prepared image having the 2D background blank canvas and the added perspective and scale. The selected 3D model may then be moved or adjusted within the image. In some examples at 250, the 2D background may be replaced with an alternate 2D background prepared with appropriate perspective and scale. It should be appreciated that although disclosed in regards to replacing or displaying a single object, one or more objects may be retained within the 2D background.

FIG. 3 illustrates a block diagram for the engine for virtual visualization of 3D models of objects in 2D environment 300. The engine for virtual visualization of 3D models of objects in 2D environment 300 may include a receiving module 206, an importing module 208, a visualizing module 210, an adding scale and perspective module 211, a superimposing module 212, an object replacing module 214, a moving module 216, a modify object module 217, a spinning module 218, a saving module 224, an uploading module 226 and a purchasing module 228.

Although various modules of the engine for visualization of 3D models of objects in 2D environment 300 are shown together, the engine for visualization of 3D models of objects in 2D environment 300 may be implemented as a web service, via a distributed architecture, or within a cloud computing environment. The files created with this application may contain perspective, scale and 3D model information in addition to the 2D graphic background information. The files may be shared, or sent to, or opened on any user devices which may be configured to display these files.

The receiving module 206 may be configured to receive inputs from the user 120 regarding an import request. The import requests may include user-specified data regarding a 2D environment, such that the 2D environment may be used as a background environment for displaying one or more 3D models of objects. The importing module 208 may be configured to import the 2D environment. The 2D environment may be a 2D photograph of an interior space such as a living room, or a bedroom, or a kitchen space, or a bathroom, or a garage, or an office space, and so forth. Additionally, the 2D environment may include existing graphical materials or graphical materials captured as a still image or a live feed image.

The visualizing module 210 may help the user 120 to visualize the imported 2D environment. The visualizing module 210 may be configured to receive a superimposing request from the user 120. The superimposing request may include object information data related to a 3D object.

The user 120 may select the 3D object from a library of 3D objects or from 3D objects imported or saved by the user, which the user may have customized or made changes to. The received superimposing request is passed to the superimposing module 212, which superimposes the selected 3D object, based on the superimposing request onto the 2D environment.

A non-limiting example of a 3D object may be a display. The display may be any of a television, monitor, computer monitor, or visual array including, but not limited to, a liquid crystal display (LCD), light emitting diode (LED) display, organic light emitting diode (OLED) display, cathode based display, or any other display device capable of providing a visual image to a viewer. The display may be comprise any of a plurality of shapes, such as square, rectangular, curved, round, or any suitable geometric shape. Further, the display may include a support frame, may be frameless, or any other structural form factor known in the art. The display may be a stand-alone display or one of a plurality of display units comprising a composite display including multiple display units.

In addition, the visualizing module 210 may be further configured to receive a request for object replacement from the user. The object replacement request may include object information data or metadata encoding object information data including dimensions, or color, or material type of the 3D object selected from the library of 3D objects. The received object replacement request is passed to the object replacing module 214, which changes the object, based on the request. Additionally, the selected 3D object may be replaced by the user 120 with another 3D object. For example, the user may replace a large chair with a small chair in a 2D environment after visualizing both the large chair and the small chair in the 2D environment.

The visualizing module 210 may further help the user 120 to alter view settings such as brightness or contrast of the imported 2D environment. Altering the brightness or contrast of the 2D environment may allow the user to visualize the positioning of the 3D object in the 2D environment under more light or less light situations. For example, the user may be able to visualize and appreciate how the 3D object superimposed on the 2D environment may look during day time versus night time conditions, or conditions of bright lighting or dim lighting where a lamp or light fixture is being used. Additionally, the visualizing module 210 may also help the user with directional options, such as a compass or a north facing arrow to identify the orientation of the 2D environment. The user may prefer directional options for personal reasons, or aesthetic preference, or for daylight requirement needs.

The visualizing module 210 may be further configured to receive scale data (defining the scale of the 2D environment) and the perspective data (defining the perspective of the 2D environment) request from the user. The scale data and perspective data request is passed on to the adding scale and perspective module 211, which allows the user to adjust the scale and perspective of the 2D environment.

The method then moves on to the moving module 216. The moving module 216 may be configured to receive an object spinning request for rotational movement of the 3D object imported on to the 2D environment. The spinning request thus received is passed on to the spinning module 218, which allows spinning or any such rotational movement of the 3D object in the 2D environment. For example, the 3D object inserted onto the 2D environment might be a chair or triangular table, and the user may prefer to precisely orient the chair seat in a particular direction or in case of the triangular table, the user may prefer the three corners of the table oriented in a certain preferred directions.

As the user finalizes the appropriate color, material, positioning and spinning of the selected 3D object within the 2D environment, the resulting image may be uploaded to a social network website, microblogging service, blog or any other website resources by the uploading module 226. Thereby, the user 120 may receive inputs from contacts such as family members or friends regarding the resulting image formed by the 3D object placement in the 2D environment. With appropriate inputs, the user 120 may choose to alter the resulting image of the 3D object in the 2D environment. In addition, based on user request, the saving module 224 may save the resulting image for future use or reference. Alternatively, the user 120 may be highly satisfied with the overall look of the 3D object in the 2D environment and decide to purchase the 3D object. In such a situation the purchasing request is passed to the purchasing module, 228. In some embodiments, a contact of the user 120 via social networking websites in the web application 204, may request the user to purchase the 3D object in consideration.

Figure 4A:
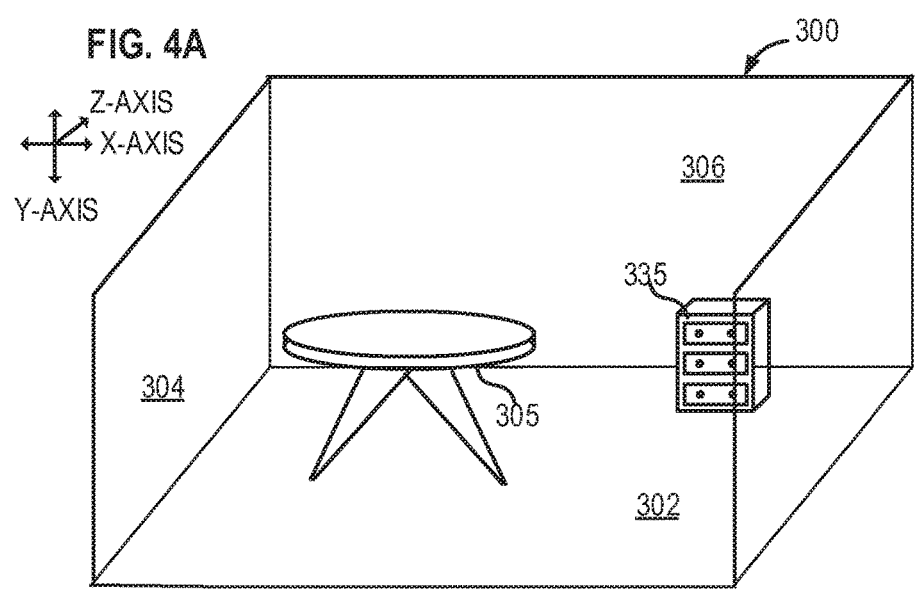

Turning now to FIGS. 4A, 4B, 4C and 4D. FIG. 4A illustrates an example 2D environment 300 of a user's room. The example 2D environment 300 of the user's room may include an interior space bounded by a wall 304, a wall 306, a ground plane 302 (e.g. a flooring surface), a chest of drawers 335 and a center table 305, as illustrated in FIG. 4A. The center table 305 and chest of drawers 335 may be configured to be part of the 2D environment 300. The user may decide to add scale and perspective to the 2D environment 300 of the user's room, before superimposing any 3D objects.

Figure 4B:
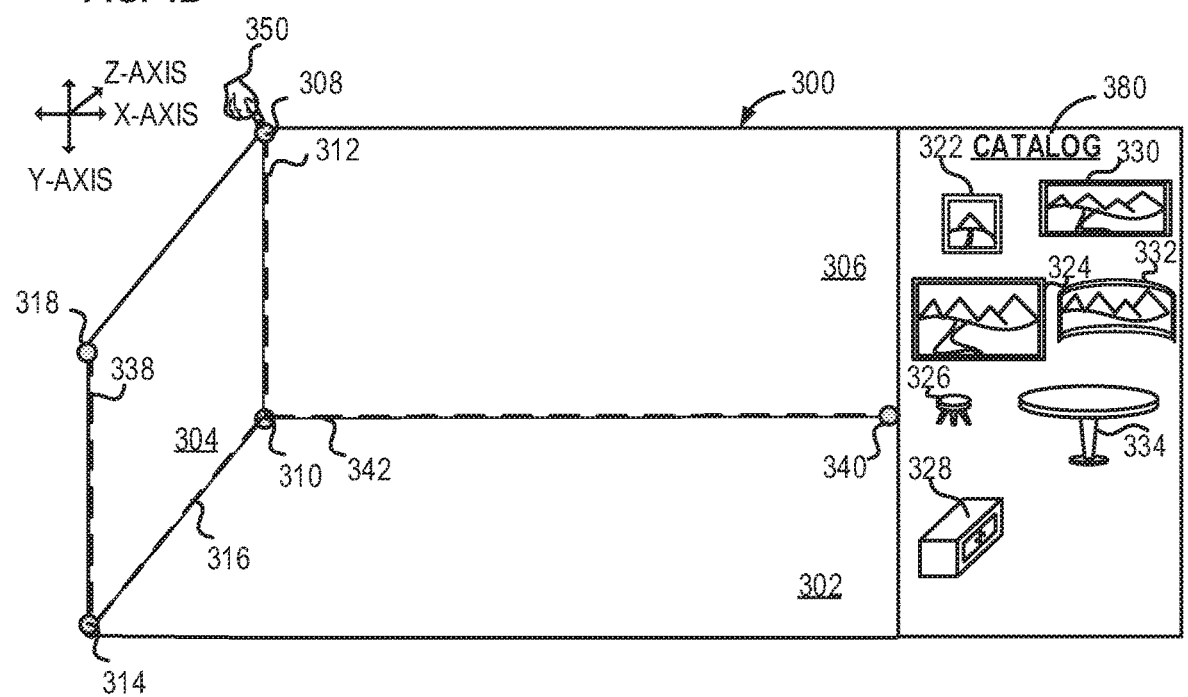

The user may select intersection points, which may be the corner of a room or any point in the room environment where two or more planes meet. The plane may be a wall plane or a ground plane or a top plane, and so forth. As shown in FIG. 4B, the center table 305 and chest of drawers 335 may be removed from the environment 300 to add scale and perspective to the 2D environment 300. The user may use the finger icon 350 or other suitable indicator to select an intersection point 308, between the wall 306 and the wall 304. Then the user may select another intersection point 310, between the wall 304, the wall 306 and the ground plane 302. The selected intersection points 308 and 310 may then be connected by a dashed line 312, defining the intersection of the wall 306 and the wall 304. Such selection of intersection points and joining of intersection points may allow the user to precisely define the 2D environment 300. The user may continue to select more intersection points and connect the selected intersection points to precisely define scale and perspective of the 2D environment 300. In some embodiments, a three-dimensional model of center table 305 and a three-dimensional model of the chest of drawers 336 may be generated or imported by the importing module and superimposed onto the two-dimensional environment in a same position and a same perspective occupied by center table 305 and chest of drawers 335, respectively. Alternatively, center table 305 and chest of drawers 335 may not be superimposed onto the two-dimensional environment and the three-dimensional model, center table 334, corresponding to center table 305 may be added to library 320 as illustrated in FIG. 4B.

As shown in FIG. 4B, the user may select an intersection point 314, between wall 304 and the ground plane 302. The user may connect the previously selected intersection point 310 and the intersection point 314 with a dashed line 316. The dashed line 316, defines the intersection of the wall 304 and the ground plane 302. Further, the user may select an intersection point 318, positioned at the top corner of the wall 304. The user may connect the intersection point 314 with the intersection point 318 by a dashed line 338. Further still, the user may select an intersection point 340 between the wall 306 and the ground plane 302. The intersection point 340 may be connected to the intersection point 310 by a dashed line 342. The intersection points and the dashed lines so formed may help the user define the environment 300 in an accurate manner with scale and perspective.

With the scale and perspective of the environment 300 defined, the user may now decide to superimpose a 3D object from an interactive catalog onto the 2D environment 300. The interactive catalog 380 may include various 3D objects that may be imported onto the 2D environment 300. As shown in FIG. 4B, the interactive catalog may include a square display 322, display 324, a step stool 326, a small drawer 328, narrow display 330, curved display 332, a center table 334 and a chest of drawers 336. The interactive catalog 380 may include but is not restricted to the 3D objects illustrated. Additionally, when a 3D object is selected, a menu bar may be displayed indicating if the object selected is a floor object, a wall object or a ceiling object. A finger icon 350 or other suitable indicator, as illustrated in FIG. 4B, may be used to select an item from the library 320 and drag it to the 2D environment 300. Alternatively, the user may use keyboard, or touch pad, or mouse key on one of the user devices 130, to select and drag 3D objects onto the 2D environment 300.

As the wall planes and ground planes have been accurately demarcated by the user, the user may precisely position the display 324, selected form the interactive catalog 380 onto the 2D environment 300. The presence of the intersecting lines and intersection points defining and demarcating the planes such as the wall planes, the ground plane and the top plane from one another, helps the user position the display 324 precisely and accurately, without overlapping an intersecting line or intersection point.

Figure 4C:
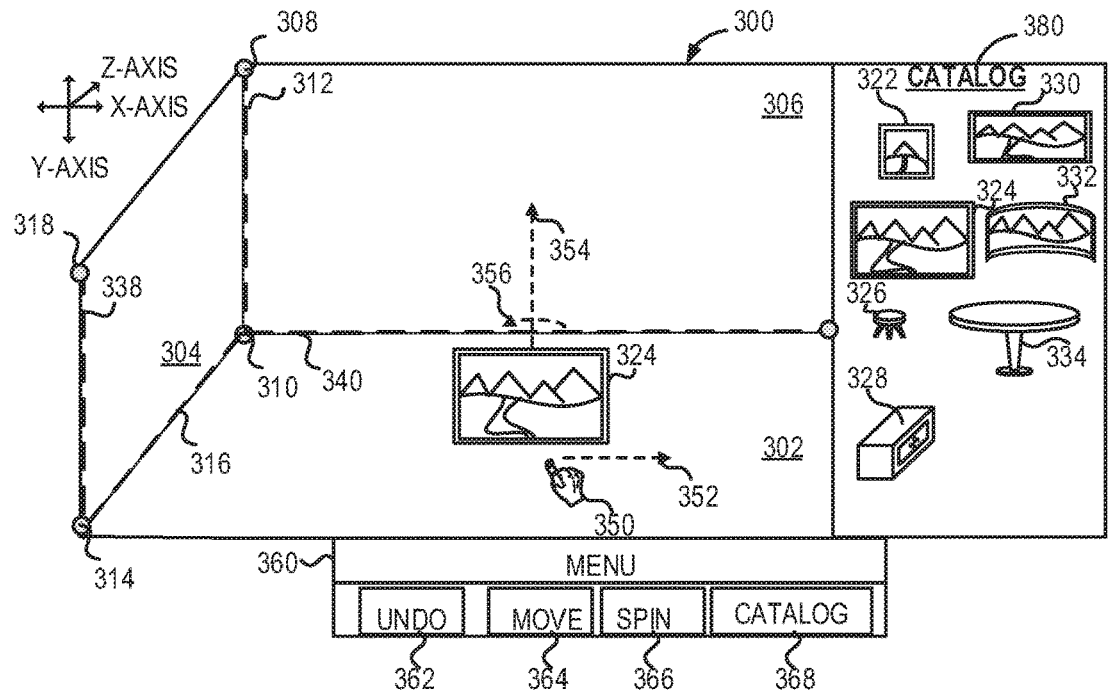

As the display 324 is positioned in a satisfactory manner, the user may now decide to alter the position of the display 324 by moving or spinning (e.g., rotating) the display 324. As illustrated in FIG. 4C the user may use the finger icon 350 or other suitable indicator to select the display 324 and display a menu bar 360. The menu bar 360 may include several options displayed by virtual icon buttons. For example, a virtual icon button 362 may be selected by the user to "UNDO" an action performed, such as selection of a 3D object from the interactive catalog 380. Another virtual icon button 364 may be selected by the user to move the selected 3D object, the display 324 in the example illustrated in FIG. 4C. The user may select the virtual icon button 364 to move the display 324 sideways, as shown in FIG. 4C along a dashed arrow 352.

A further virtual icon button 366 may be selected by the user to "SPIN" or rotate the selected 3D object along an axis passing through the selected 3D object. The user may decide to rotate or spin the display 324 along a dashed curve arrow 356 about an axis 354, shown as a dashed upward arrow passing through the center of the display 324.

Figure 4D:
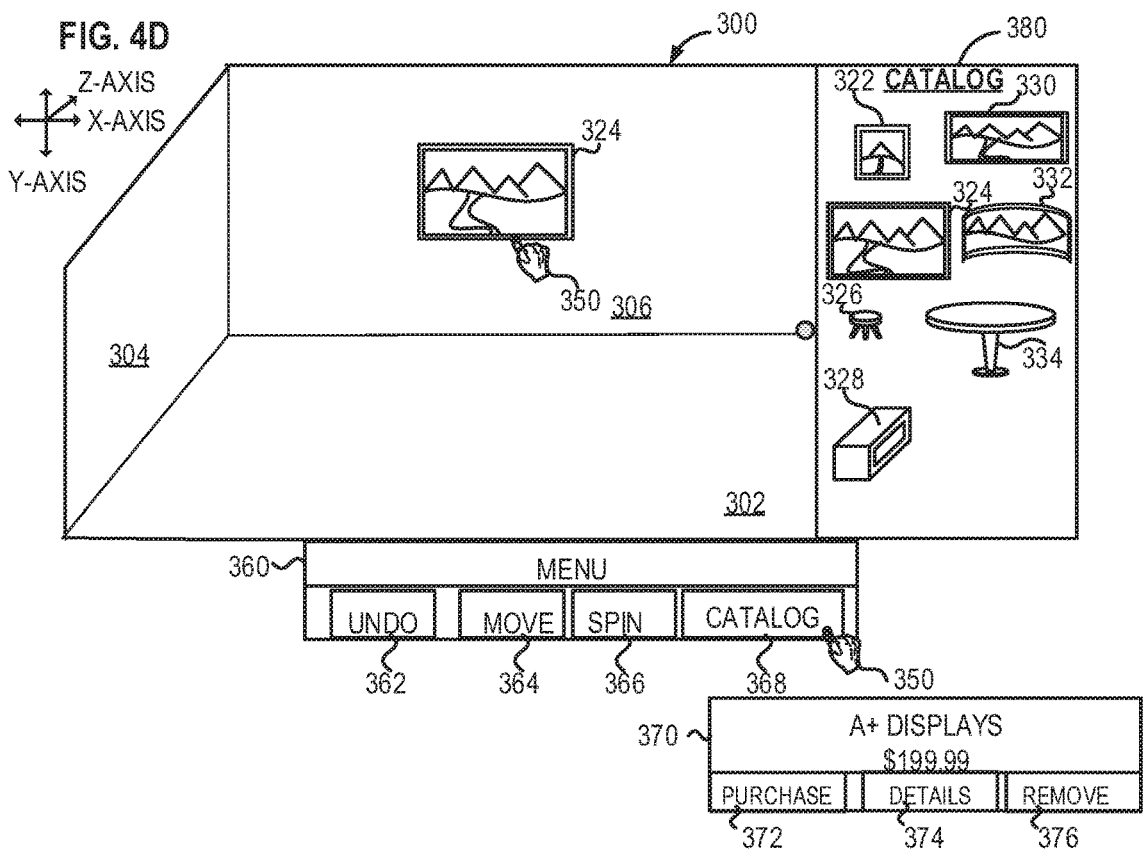

Turning to FIG. 4D, the user may use the finger icon 350 or other suitable indicator to select another virtual icon button 368 displayed in the menu bar 360. The virtual icon button 368 may be selected by the user for displaying an interactive catalog menu related to the 3D object, in our example here, the display 324. The interactive catalog may be configured to display price information, product details, purchasing option, removal option, and so forth. Pricing details may further include name of the manufacturer, and/or retailer information. Product detail information may include geometric information of the product, such as height, weight information. Further, product details may also include color and material texture information of the 3D object selected.

As illustrated in FIG. 4D, selecting the virtual icon button 368, may display another menu bar 370. The menu bar 370 may display the name of the manufacturer and the price of the selected 3D object. In the example shown in FIG. 4D, the display 324, may be manufactured by A+ Displays and may be sold at a sale price of $199.99 by the manufacturer or other vendor. In other examples, the name of the manufacturer may vary or the same 3D object may be sold by more than one manufacturer. In such examples, where more than one manufacturer may be selling the same 3D object, more than one sale price may be displayed in the menu bar 370. In addition to the name of the manufacturer and the sale price, the menu bar 370 may also provide the user with the option of purchasing the 3D object, by selecting the virtual icon button 372 to "PURCHASE." Alternatively, the user may decide to learn some further details about the 3D object and select virtual icon button 374 to view additional details, in this example, the display 324. Further details about the display 324 selected may include details about the type of material used to manufacture the display, the dimensions of the display, the weight of the display, the power requirements of the display, and so forth. The user may decide after learning the details of the display material, the display dimensions and the display price that he would prefer to browse other display options. In such an example, the user may select the virtual icon button 376 to "REMOVE" the selected display 324 from the 2D environment 300. In some examples, after browsing other display options, the user may decide to purchase the display 324. The user may then select the display 324 from the interactive catalog 380 and superimpose the display 324 on to the environment 300 and display the menu bar 370, where the user may now select the virtual icon button 372 to purchase the display 324.

In some embodiments, the user may decide to superimpose a plurality of 3D objects onto the two-dimensional environment. For example, the interactive catalog may display a complete room with multiple 3D objects within the room. The user may select to superimpose the entire room into the 2D environment. The plurality of 3D objects may be superimposed onto the 2D environment.

In FIG. 4E, the user may actuate virtual icon button 368 to view interactive catalog 380. Interactive catalog 380 may include one or more images of design rooms, such as design room 390 shown. Each design room may include plurality of 3D objects arranged in the space of the room. The user may select the predesign room and the plurality of 3D objects may be superimposed onto the two-dimensional environment. For example, design room 390 may include a table 334, a square display 322, a display 324, and two stools 326. The user may select design room 390 with finger icon 350 or any other suitable indicator. Upon selection of design room 390, table 334, square display 322, display 324 and both of the two stools 326 may be superimposed onto two-dimensional environment 300 as shown. In some embodiments, interactive catalog 380 may include an additional virtual button, or any other suitable executable to allow the user to select design room 390.

Continuing to FIG. 4F, the user may view objects in library 320 in addition to the interactive catalog 380. The user may superimpose additional 3D objects onto the two-dimensional environment. For example, the user may return to library 320 and select chest of drawers 336 or any other 3D object within library 320 using finger icon 350 or any other suitable indicator. The user may then place the chest of drawers as indicated by dashed finger icon 350A and dashed chest of drawers 336A within the two-dimensional environment 300. The user may add additional 3D objects from either the catalog 380 or library 320 as space permits within the two-dimensional environment.

Figure 4G:
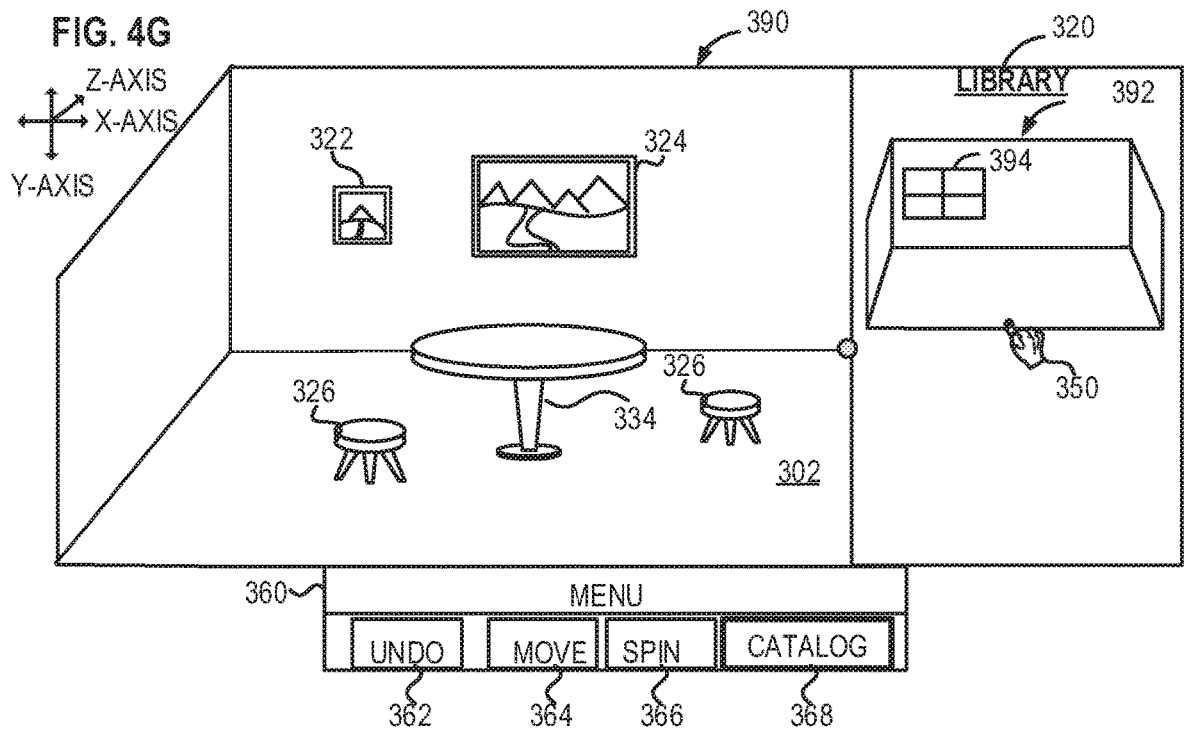
Figure 4H:
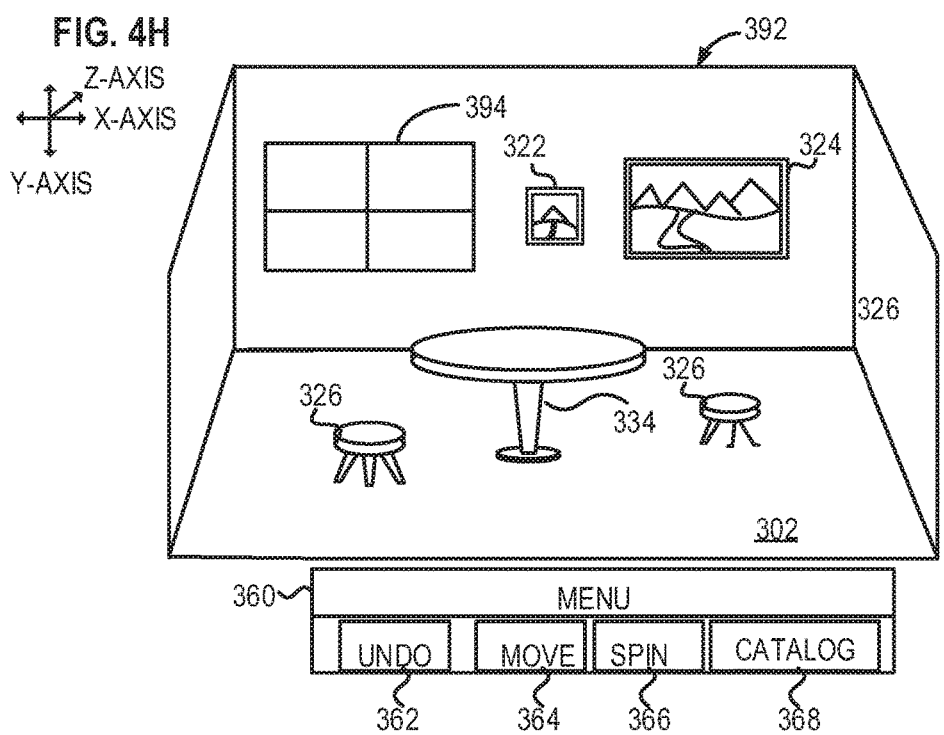

FIGS. 4G and 4H illustrate another embodiment where a first 2D environment may be replaced with a second 2D environment. FIG. 4G illustrates the design room 390 including a table 334, a square display 322, a display 324, and two stools 326. The user may select 2D environment 392 from library 320. 2D environment 392 may differ geometrically, and/or may contain topographical features that differ from design room 390, such as window 394, example. The user may select 2D environment 392 from the library, and the 2D environment of design room 390 may be replaced with 2D environment 392. Table 334, a square display 322, a display 324, and two stools 326 may then be displayed in the 2D environment 392. In some embodiments, the position of 3D objects within the second 2D environment may be altered to accommodate the specific geography and/or topography of the second 2D environment. In FIG. 4H, the position of square display 322 and display 324 may be shifted to accommodate window 394. It will be appreciated that square display 322 may be moved within the second 2D environment automatically as illustrated or manually by the user.

In some embodiments, square display 322 may be superimposed onto the second 2D environment in a same position without accommodating the geometry of the second 2D environment. In still other embodiments, the second 2D environment may not be displayed in examples where the geometry and topography of the second 2D environment are incompatible with the arrangement of the 3D objects within the first 2D environment.

FIG. 5 illustrates an example flow chart of a method 400 for positioning and aligning 3D objects in 2D environment. The method 400 may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 400 may be performed by the various modules discussed above with reference to FIG. 2. Each of these modules may comprise processing logic.

Method 400 begins at 404 where the user 120 may obtain a 2D environment according to an import request. Then the receiving module 206 may receive, from the user, scale and perspective data on ground plane. Similarly, the receiving module 206 may receive, from the user, scale and perspective data on ceiling height. The user may define the ceiling and ground plane by selecting points on the 2D environment.

At operation 410, the selected 3D model of the object may be superimposed on the 2D environment relative to the scale and perspective of the 2D environment. As discussed above in reference to FIG. 2, the moving module 216 may receive a request to move the 3D objects in the 2D environment. The request to move or reposition the 3D objects may include data on the selection of a direction by the user. As examples, the 3D objects may be moved in a vertical and/or horizontal direction. As another example, the 3D object may be rotated about a vertical, horizontal, and/or other rotational axis.

At operation 412, the user may position the 3D object in the 2D environment. Move objects 420 includes operations 422, 424, and 426. At operation 422 the user may need to move the object. Moving the object may include movement along a horizontal plane or X-axis, or along a vertical plane or Y-axis. Further, moving of the 3D object may involve translating or rotating the 3D object at operation 424. At operation 426, a new position is assigned to the 3D object. At operation 432, the user may not be satisfied with the 3D object superimposed on the 2D environment and may decide to replace the existing object.

If the user decides to replace the object, then the method moves to operation 434 where the user may select a new 3D object from the library, such as the library 320 discussed in FIG. 4A.

Method 400 may then move to method 500 of FIG. 6. In some embodiments method 500 may optionally include replacing the 2D environment. At operation 502, the user may have the option to replace the 2D environment. As discussed above with respect to FIGS. 4G and 4H, a first 2D environment may be displayed to the user where the first 2D environment may include one or more 3D models of objects superimposed upon the first 2D environment. The user may select a second 2D environment that is different than the first 2D environment and provide a replace 2D environment request.

At operation 504, the user may select a new 2D environment. The new 2D environment may be provided in the user's library, the interactive catalog, or imported from a remote source. At operation 506, the first 2D environment may be removed. Method 500 may then continue to operation 508 where the second 2D environment may be displayed including the one or more 3D models of objects that were superimposed onto the first 2D environment superimposed onto the second 2D environment. In some embodiments, the one or more 3D models of objects may be superimposed onto the second 2D environment in positions to accommodate the geometry and topology of the second 2D environment as discussed above for FIG. 4H. It will be appreciated that 3D models of objects may be repositioned within the second 2D environment automatically as illustrated in FIG. 4H or manually by the user.

If the user does not choose to replace the 2D environment method 600 may proceed to operation 510.

At operation 510, the user may have the option to display interactive catalog information for the 3D object. At this step, the visualizing module receives a request for displaying the interactive catalog associated with the 3D object.

At operation 520, the interactive catalog information may display the pricing and detailed description of the 3D object. At operation 530, the user has the option of purchasing the object for the 2D environment by selecting "Purchase" at operation 540. However, if the user is not satisfied with the 3D object selected or the price of the object or the manufacturer of the object, and so forth, the method returns to operation 410 to import another 3D object to the 2D environment.

Turning now to FIGS. 7A, 7B, 7C and D. FIGS. 7A-7D may illustrate another example 2D environment 600. The example 2D environment 600 may include an interior space bounded by a ground plane 602 (e.g. a flooring surface), a wall 604 and a wall 606. The 2D environment 600 may include a chair 610.

Further, FIG. 7A may include a menu bar 650 positioned at the bottom or lower level of the display screen. The menu bar 650 may aid a user to access various functions for customizing the 2D environment. In the example menu bar 650 shown in FIG. 7A, a first virtual button 652, a second virtual button 654, a third virtual button 656, a fourth virtual button 658, a fifth virtual button 660 and a sixth virtual button 662 are presented along the menu options in the menu bar 650. The first virtual button 652, which is labeled "Live Mode," may be selected by the user 120 to visualize a 2D environment with any of the user devices 130, discussed above. The "Live Mode" button allows the user 120 to switch between edit mode (where objects may be moved, edited and so forth) and a "live" mode where the end result is displayed.

The second virtual button 654, which is labeled "Create Walls," may be selected by the user 120 to form walls within the 2D environment. The third virtual button 656, which is labeled "Add Products," may be selected by the user 120 to add 3D objects to the 2D environment 600. These 3D objects may be obtained by the user 120 from the network 202 or from information sharing via social networking in the web applications 204. In one example, the user may select one or more 3D objects from a catalog of 3D objects from multiple vendors and 3D object sources to display in the 2D environment.

If the user decides to superimpose an additional 3D object onto the 2D environment 600, then the user may select another 3D object from a library, similar to the library 320 described in FIG. 4A. The user may access the library by clicking on or selecting the Add Products button, third virtual button 656, on the menu bar 650. The user may use one or more of the input devices of user devices 130 to access the Add Products button, third virtual button 656. The additionally selected 3D object may then be superimposed on the 2D environment 600.

The fourth virtual button 658, which is labeled "Undo" may be selected by the user 120 to undo a prior modification of the selected 3D objects, or a most recent selection of the 3D object. For example, if the user 120 is not satisfied with the positioning of a 3D object with respect to the chair 610, the user 120 may undo the addition or superimposing of the 3D object onto the 2D environment 600. The fifth virtual button 660, which is labeled "Redo" may be selected by the user 120 to redo a movement of the 3D object that was recently performed. For example, the user 120 may decide to move a 3D object superimposed on the 2D environment horizontally. The user may further decide to move the 3D object, in which case the user may select the fifth virtual button 660 to "Redo" the horizontal move to repeat the previous move.

The sixth virtual button 662, which is labeled "View Settings," may be selected by the user 120 to review the settings of the 2D environment, in this example, 2D environment 600. For instance, the user 120 may not be satisfied with the brightness of the 2D environment 600 and hence would prefer to adjust the brightness, or the user 120 may not be satisfied with the color contrast of the room and would prefer to adjust the contrast settings. Additionally, the View Settings button, sixth virtual button 662, may provide the option of direction via a compass or a north pointing directional arrow. This may aid the user 120 in placing 3D objects in a particular preferred direction. Several users may have directional preference for placing of objects with respect to object material type and color and the directional aspect is hence very useful for such purposes.

Furthermore, the user 120 may save and share screenshots of the 3D object positioned in the 2D environment 600. The user may further have access to another menu bar 640. The menu bar 640 may be displayed with a virtual icon arrow 648, displayed at the top right corner in FIG. 7A. The menu bar 640 provides the user with the option to obtain help with a "Help" virtual icon button 642, or share the current image with a "Share" virtual icon button 644. The user may decide to obtain help or input from contacts in social networking groups in the web application 204 by sharing images of the 2D environment 600 with the 3D object. Further, the user may be satisfied with the placement of the 3D object in the 2D environment and may then select a virtual icon button 646 to indicate "Done" or completion.

Turning to FIG. 7B, similar to FIG. 4B, the user may prefer to remove already existing objects from the 2D environment 600. In this case the user may remove the chair 610, and add scale and perspective to the 2D environment 600. The user may select an intersection point 612, between the wall 604, the wall 606 and the ground plane 602. Further, the user may select another intersection point 614 and then connect the intersection points 612 and 614 by a line 616, separating the plane of wall 604 from the ground plane 602. Further the user may select an intersection point 618 at the intersection of wall 606 and ground plane 602. Intersection points 612 and 618 may be connected by a line 620, such that line 620 separates the plane of wall 606 from the ground plane 602. The user may further project a line 622 from the intersection point 612 towards the top plane (e.g., ceiling plane) and a line 624 from the intersection point 618 towards the top plane.

The user may decide to add a 3D object from a library, similar to the library 320 described in FIG. 4A. As illustrated in FIG. 7C, the user may decide to add a chair 630 to the 2D environment 600. The scale addition with intersection points and lines as described in FIG. 7B may help the user in accurate and precise positioning of the chair 630.

Turning to FIG. 7D, the user may decide to move the chair 630 along an X-axis or along a Y-axis. The user may move the chair horizontally or along an X-axis, with a horizontal virtual icon button 638 on a horizontal scale 636. Similarly the user may move the chair 630 along a Y-axis, with a vertical virtual icon button 634 on a vertical scale 632.

Further still, the user may select a select a virtual icon button 664 on the menu bar 650. In the example illustrated in FIG. 7D, the virtual icon button 664 may be configured to read "My SpaceView". The user may select virtual icon button 664 and a further menu bar 670 may be displayed. Menu bar 670 may display the name of the manufacturer for the chair 630 and the price associated with the chair 630. The user may decide to read further details regarding the chair 630 by selecting a virtual icon button 672 for "Details" on the menu bar 670. The user may be satisfied with the selection of the chair 630, the price as seen from the menu bar 670 and may decide to purchase the chair 630 by selecting a virtual icon button 674 for "Purchase". Alternatively, the user may not be satisfied with the chair 630 or the price associated with the chair 630 or the manufacturing place for the chair 630. The user may then decide to remove the chair 630 from the 2D environment with the help of a virtual icon button 676 in the menu bar 670.

The menu bar 650 further includes a virtual icon button 668, for "Favorites". The virtual icon button 668 may be selected by the user to save 3D object selection for the 2D environment 600 as favorites or preferred selections.

FIG. 8 shows an example electronic form of a computer system 700, within which a set of instructions for causing a machine to perform any one or more of the methodologies discussed herein may be executed. The machine may be a PC, a tablet PC, a set-top box (STB), a PDA, a cellular telephone, a web appliance, a network router, switch or bridge, or any machine capable of executing a set of instructions (sequential or otherwise) that specify actions to be taken by that machine. In several example embodiments, the machine operates as a standalone device or may be connected to other machines (e.g., networked). In a networked disposition, the machine may operate in the capacity of a server or a client machine in a server-client network environment.

The example computer system 700 may be configured to include a processor or multiple processors 702 (e.g., a central processing unit (CPU), a graphics processing unit (GPU), or both), a main memory 704 and a static memory 706, which communicate with each other via a bus 708. The computer system 700 may further include a video display unit 710 (e.g., a liquid crystal display (LCD) or a cathode ray tube (CRT), and the like). The computer system 700 may also include an alphanumeric input device 712 (e.g., a keyboard, and the like), a cursor control device 714 (e.g., a mouse, touchpad, touchscreen, and the like), a disk drive unit 716 for reading computer readable medium (e.g., USB thumb drive, solid state memory drives, and the like), a signal generation device 718 (e.g., a speaker, and the like (e.g., network interface card, and the like), and a network interface device 720.

Further, the disk drive unit 716 may include a computer-readable medium 722, on which is stored one or more sets of instructions and data structures (such as instructions 724) embodying or utilized by any one or more of the methodologies or functions described herein. Additionally, the instructions 724 may also reside, completely or partially, within the main memory 704 and/or within the processors 702 during execution by the computer system 700. The main memory 704 and the processors 702 may also constitute machine-readable media. Further still, the instructions 724 may be transmitted or received over a network 726 via the network interface device 720 utilizing any one of a number of well-known transfer protocols (e.g., Hyper Text Transfer Protocol (HTTP)).

The computer-readable medium 722 may include a single medium or multiple media (e.g., a centralized or distributed database and/or associated caches and servers) that store the one or more sets of instructions. The term "computer-readable medium" may further include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. Further, "computer-readable medium" may further include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like.

It will be appreciated that the configurations and routines disclosed herein are exemplary in nature, and that these specific embodiments are not to be considered in a limiting sense, because numerous variations are possible. For example, the above technology can be applied to various 3D objects superimposed on various 2D environments. The subject matter of the present disclosure includes all novel and non-obvious combinations and sub-combinations of the various systems and configurations, and other features, functions, and/or properties disclosed herein.

The above-disclosed embodiments may be combined with one or more of the embodiments and disclosures in U.S. Provisional Patent Application No. 61/992,629 entitled "METHOD FOR PROVIDING SCALE TO ALIGN 3D OBJECTS IN 2D ENVIRONMENT" filed May 13, 2014, one or more of the embodiments and disclosures in U.S. Provisional Patent Application No. 61/992,759 entitled "METHOD FOR FORMING WALLS TO ALIGN 3D OBJECTS IN 2D ENVIRONMENT", filed on May 13, 2014, one or more of the embodiments and disclosures in U.S. Provisional Patent Application No. 61/992,719 entitled "METHOD FOR PROVIDING A PROJECTION TO ALIGN 3D OBJECTS IN 2D ENVIRONMENT", filed May 13, 2014, one or more of the embodiments and disclosures in U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014, and/or one or more of the embodiments and disclosures in U.S. Provisional Patent Application No. 61/992,746 entitled "METHOD FOR REPLACING 3D OBJECTS IN 2D ENVIRONMENT", filed May 13, 2014. The entire contents of each provisional application referenced herein are hereby incorporated by reference for all purposes. For example, and not as a limitation, the embodiments herein may be combined with the elements and features disclosed in Provisional Application No. 61/992,629, the embodiments herein may be combined with the elements and features disclosed in Provisional Application No. 61/992,759, in combination with one or more of the elements and features disclosed in Provisional Application No. 61/992,719, in combination with one or more of the elements and features disclosed in Provisional Application No. 61/992,774, and/or in combination with one or more of the elements and features disclosed in Provisional Application No. 61/992,746. These combinations may include one or more features disclosed in one or more of the referenced provisional applications, including combinations of embodiments disclosed herein with features shown in one, two, three, four, or five of the provisional applications.

Further, the entire contents of each concurrently filed application, U.S. Non-Provisional patent application No. entitled "METHOD FOR PROVIDING SCALE TO ALIGN 3D OBJECTS IN 2D ENVIRONMENT" filed May 12, 2015, U.S. Non-Provisional patent application No. entitled "METHOD FOR FORMING WALLS TO ALIGN 3D OBJECTS IN 2D ENVIRONMENT", filed on May 12, 2015, U.S. Non-Provisional patent application No. entitled "METHOD FOR PROVIDING A PROJECTION TO ALIGN 3D OBJECTS IN 2D ENVIRONMENT", filed May 12, 2015, U.S. Non-Provisional patent application No. entitled "METHOD FOR MOVING AND ALIGNING 3D OBJECTS IN A PLANE WITHIN THE 2D ENVIRONMENT", filed May 12, 2015, and/or U.S. Non-Provisional patent application No. entitled "METHOD FOR REPLACING 3D OBJECTS IN 2D ENVIRONMENT", filed May 12, 2015, referenced herein are hereby incorporated by reference for all purposes.

The foregoing description is illustrative of particular embodiments of the invention, but is not meant to be a limitation upon the practice thereof.

The foregoing discussion should be understood as illustrative and should not be considered limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or steps plus function elements in the claims below are intended to include any structure, material or acts for performing the functions in combination with other claimed elements as specifically claimed.

Finally, it will be understood that the articles, systems, and methods described hereinabove are embodiments of this disclosure—non-limiting examples for which numerous variations and extensions are contemplated as well. Accordingly, this disclosure includes all novel and non-obvious combinations and sub-combinations of the articles, systems, and methods disclosed herein, as well as any and all equivalents thereof.

The invention claimed is:

1. A method, comprising:
   removing a two-dimensional representation of a first object within a first two-dimensional environment and displaying the first two-dimensional environment without the first object;
   superimposing, with a processor, a first three-dimensional model of a second object onto the first two-dimensional environment with a scale and a perspective of the first three-dimensional model of the second object relative to a scale and a perspective of the first two-dimensional environment; and
   for the first object, generating a replacement three-dimensional model of the first object, and superimposing within the first two-dimensional environment the replacement three-dimensional model of the first object in a same position and perspective occupied by the first object before removal from the first two-dimensional environment.

2. The method of claim 1, further comprising receiving, with the processor, from a user, an import request to import the first two-dimensional environment to be used as a background for the first three-dimensional model, and importing, with the processor, based on the import request, the first two-dimensional environment.

3. The method of claim 1, further comprising receiving, with the processor, from a user, a perspective request to provide t perspective to the first two-dimensional environment, wherein the perspective request includes a selection of intersection points and lines connecting the intersection points in the first two-dimensional environment that provides the perspective of the first two-dimensional environment.

4. The method of claim 3, wherein the first object is removed from the first two-dimensional environment based on the perspective request.

5. The method of claim 1, further comprising providing, with the processor, an interactive catalog comprising information about a real-life object associated with the first object or the second object, wherein the interactive catalog includes one or more of a name of a manufacturer of the real-life object, price information for the real-life object, product details about the real-life object, a purchasing option for the real-life object, and a removal option for the first object or the second object.

6. The method of claim 5, further comprising:
   receiving, from a user, a request to superimpose a plurality of three-dimensional models displayed within the interactive catalog; and
   superimposing, based upon the request to superimpose the plurality of three-dimensional models, the plurality of three-dimensional models onto the first two-dimensional environment.

7. The method of claim 1, further comprising:
   receiving from a user, a replace two-dimensional environment request;
   removing the first two-dimensional environment; and
   displaying a second two-dimensional environment including the first three-dimensional model or the replacement three-dimensional model superimposed onto the second two-dimensional environment, where the second two-dimensional environment is different from the first two-dimensional environment.

8. The method of claim 1, further comprising providing a remove executable configured to, upon execution of the remove executable, remove the first three-dimensional model or the replacement three-dimensional model from the first two-dimensional environment.

9. A system, comprising:
   a processor; and
   a storage device, the storage device containing instructions executable by the processor, comprising:
      an importing module configured to import a first two-dimensional environment, the first two-dimensional environment comprising a two-dimensional representation of a first object;
      a superimposing module configured to superimpose a first three-dimensional model of the first object onto the first two-dimensional environment with a scale and a perspective of the first three-dimensional model of the first object relative to a scale and a perspective of the first two-dimensional environment;
      a receiving module configured to receive a replace two-dimensional environment request to replace the first two-dimensional environment including the first three-dimensional model of the first object superimposed onto the first two-dimensional environment, wherein the importing module is further configured to import, based upon the replace two-dimensional environment request, a replacement two-dimensional environment; and
      a visualizing module configured to display the replacement two-dimensional environment and the first three-dimensional model of the first object superimposed onto the replacement two-dimensional environment, wherein a position of the first three-dimensional model of the first object is adjusted within the replacement two-dimensional environment based on the replacement two-dimensional environment.

10. The system of claim 9, wherein the visualizing module is further configured to display an interactive catalog, wherein the interactive catalog includes one or more three-dimensional models of additional objects, each of the one or more three-dimensional models of the additional objects superimposable upon the first two-dimensional environment or the replacement two-dimensional environment, wherein the interactive catalog includes one or more of a vendor, price information, product details about the additional objects, a purchasing option, and a removal option corresponding to the additional objects.

11. The system of claim 10, wherein the interactive catalog includes a remove executable configured to, upon execution of the remove executable, remove the first three-dimensional model from the first two-dimensional environment.

12. The system of claim 9, wherein the visualizing module is configured to remove a second object represented in two dimensions from the first two-dimensional environment and display the first two-dimensional environment without the second object.

13. The system of claim 12, wherein the importing module is further configured to, for each of the second object, import a replacement three-dimensional model of the second object.

14. The system of claim 13, wherein the superimposing module is further configured to, for the second object, superimpose the replacement three-dimensional model of the second object in a same position and perspective occupied by the second object before removal from the first two-dimensional environment.

15. The system of claim 9, wherein
the receiving module is further configured to receive, from a user, a request to superimpose a plurality of other three-dimensional models displayed within an interactive catalog; and
the superimposing module is further configured to superimpose, based upon the request to superimpose the plurality of other three-dimensional models, the plurality of other three-dimensional models onto the first two-dimensional environment or the replacement two-dimensional environment.

16. A system, comprising:
a processor; and
a storage device, the storage device containing instructions executable by the processor, comprising:
a visualizing module configured to remove an object from a first two-dimensional environment and display the first two-dimensional environment without the object; and
a superimposing module configured to superimpose a first three-dimensional model of the object onto the first two-dimensional environment with a scale and a perspective of the first three-dimensional model of the object relative to a scale and a perspective of the first two-dimensional environment, the superimposing module further configured to, for the object, superimpose a replacement three-dimensional model of the object in a same position and perspective occupied by the object before removal from the first two-dimensional environment.

17. The system of claim 16, wherein the storage device further contains instructions executable by the processor, comprising:

a receiving module configured to receive a replace two-dimensional environment request to replace the first two-dimensional environment including the first three-dimensional model of the object superimposed onto the first two-dimensional environment; and
an importing module configured to import, based upon the replace two-dimensional environment request, a replacement two-dimensional environment; and
wherein the visualizing module is further configured to display the replacement two-dimensional environment and the first three-dimensional model of the object superimposed onto the replacement two-dimensional environment, wherein a position of the first three-dimensional model of the object is adjusted within the replacement two-dimensional environment based on the replacement two-dimensional environment.

18. The system of claim 17, wherein
the receiving module is further configured to receive, from a user, a request to superimpose a plurality of other three-dimensional models displayed within an interactive catalog; and
the superimposing module is further configured to superimpose, based upon the request to superimpose the plurality of other three-dimensional models, the plurality of other three-dimensional models onto the first two-dimensional environment.

19. The system of claim 18, wherein the interactive catalog includes a remove executable configured to, upon execution of the remove executable, remove the first three-dimensional model of the object or any of the plurality of other three-dimensional models from the first two-dimensional environment.

20. The system of claim 16, wherein the storage device further contains instructions executable by the processor comprising an adding scale and perspective module configured to add scale data and perspective data to the first two-dimensional environment.

* * * * *